US010593671B2

(12) United States Patent
Bae et al.

(10) Patent No.: US 10,593,671 B2
(45) Date of Patent: Mar. 17, 2020

(54) INTEGRATED CIRCUIT DEVICE AND METHOD OF MANUFACTURING SAME

(71) Applicant: SAMSUNG ELECTRONICS CO., LTD., Suwon-si, Gyeonggi-Do (KR)

(72) Inventors: Deok-Han Bae, Hwaseong-si (KR); Sang-Young Kim, Gyeonggi-Do (KR); Byung-Chan Ryu, Seongnam-si (KR); Jong-Ho You, Seongnam-si (KR); Da-Un Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/013,734

(22) Filed: Jun. 20, 2018

(65) Prior Publication Data
US 2019/0148374 A1 May 16, 2019

(30) Foreign Application Priority Data

Nov. 14, 2017 (KR) .................. 10-2017-0151723

(51) Int. Cl.
H01L 27/088 (2006.01)
H01L 27/02 (2006.01)
(Continued)

(52) U.S. Cl.
CPC .... H01L 27/0886 (2013.01); H01L 21/76224 (2013.01); H01L 21/76802 (2013.01); H01L 21/76877 (2013.01); H01L 21/823431 (2013.01); H01L 21/823437 (2013.01); H01L 21/823475 (2013.01); H01L 27/0207 (2013.01);
(Continued)

(58) Field of Classification Search
CPC ............ H01L 27/0886; H01L 27/0207; H01L 29/785; H01L 29/0847; H01L 29/41791; H01L 29/0649; H01L 29/66795; H01L 29/66545; H01L 21/823437; H01L 21/823431; H01L 21/823475;
(Continued)

(56) References Cited

U.S. PATENT DOCUMENTS 6,953,746 B2   10/2005 Uesawa
8,716,117 B2    5/2014 Kim et al.
(Continued)

FOREIGN PATENT DOCUMENTS

KR    10-0183764    12/1998
KR    10-0350767     8/2002

Primary Examiner — Dao H Nguyen
(74) Attorney, Agent, or Firm — Volentine, Whitt & Francos, PLLC

(57) ABSTRACT

An integrated circuit device includes a substrate having a fin-type active region that extends in a first direction, a gate structure that intersects the fin-type active region on the substrate and extends in a second direction perpendicular to the first direction and parallel to an upper surface of the substrate, a guide pattern that extends on the gate structure in the second direction and has an inclined side surface that extends in the second direction, source/drain regions disposed on both sides of the gate structure, and a first contact that is electrically connected to one of the source/drain regions and in which an upper portion contacts the inclined side surface of the guide pattern. The width of an upper portion of the guide pattern in the first direction is less than the width of a lower portion of the guide pattern in the first direction.

20 Claims, 18 Drawing Sheets

(51) Int. Cl.

| | |
|---|---|
| *H01L 29/08* | (2006.01) |
| *H01L 29/417* | (2006.01) |
| *H01L 29/06* | (2006.01) |
| *H01L 29/66* | (2006.01) |
| *H01L 21/8234* | (2006.01) |
| *H01L 21/768* | (2006.01) |
| *H01L 21/762* | (2006.01) |
| *H01L 29/78* | (2006.01) |
| *H01L 21/311* | (2006.01) |
| *H01L 29/165* | (2006.01) |
| *H01L 21/306* | (2006.01) |

(52) U.S. Cl.
CPC ...... *H01L 29/0649* (2013.01); *H01L 29/0847* (2013.01); *H01L 29/41791* (2013.01); *H01L 29/66545* (2013.01); *H01L 29/66795* (2013.01); *H01L 29/785* (2013.01); *H01L 29/7851* (2013.01); *H01L 21/30604* (2013.01); *H01L 21/31111* (2013.01); *H01L 21/823425* (2013.01); *H01L 21/823468* (2013.01); *H01L 21/823481* (2013.01); *H01L 29/165* (2013.01); *H01L 29/7848* (2013.01)

(58) Field of Classification Search
CPC ......... H01L 21/76802; H01L 21/76877; H01L 21/76224; H01L 21/30604
USPC ................. 257/401, 347, 369, 757, E27.088, 257/E27.112, E21.476, E21.507, E21.626; 438/283, 424, 587, 618, 637
See application file for complete search history.

(56) References Cited

U.S. PATENT DOCUMENTS

| | | |
|---|---|---|
| 9,299,608 B2 | 3/2016 | Wu et al. |
| 9,368,369 B2 | 6/2016 | Ko et al. |
| 9,530,887 B1* | 12/2016 | Chang ................ H01L 29/7848 |
| 9,997,632 B2* | 6/2018 | Chang ................ H01L 29/7856 |
| 2009/0023285 A1 | 1/2009 | Kim |
| 2016/0181383 A1* | 6/2016 | Huang ............. H01L 29/41758 257/757 |

* cited by examiner

INTEGRATED CIRCUIT DEVICE AND METHOD OF MANUFACTURING SAME

PRIORITY STATEMENT

This application claims the benefit of Korean Patent Application No. 10-2017-0151723, filed on Nov. 14, 2017, in the Korean Intellectual Property Office, the disclosure of which is hereby incorporated by reference in its entirety.

BACKGROUND

The inventive concept relates to an integrated circuit device and to a method of manufacturing the same. More particularly, the inventive concept relates to an integrated circuit device including a fin-type active region and to a method of manufacturing the same.

As electronic products become light, thin, short, and small, demands for highly integrated circuit devices have increased. In the downscaling of an integrated circuit device, a short channel effect of a transistor is generated, and thus, the reliability of the integrated circuit device deteriorates. In order to reduce the short channel effect, an integrated device including a fin-type active region has been suggested. However, as a design rule is reduced, a size of a contact structure for an electric connection to the fin-type active region is also reduced.

SUMMARY

According to an aspect of the inventive concept, there is provided an integrated circuit device including a substrate having a fin-type active region that extends longitudinally in a first direction parallel to an upper surface of the substrate, a gate structure that intersects the fin-type active region on the substrate and extends longitudinally in a second direction that is perpendicular to the first direction and parallel to an upper surface of the substrate, a guide pattern disposed atop the gate structure and extending longitudinally in the second direction, source/drain regions disposed on both sides of the gate structure, and a first contact electrically connected to one of the source/drain regions. The guide pattern has an inclined side surface, and a width of an upper portion the guide pattern being less than a width of a lower portion of the guide pattern. The first contact has an upper portion that contacts the inclined side surface of the guide pattern.

According to another aspect of the inventive concept, there is provided an integrated circuit device including a substrate having a fin-type active region that extends longitudinally in a first direction parallel to an upper surface of the substrate, a plurality of gate structures that intersects the fin-type active region on the substrate, each of the gate structures extending longitudinally in a second direction that is perpendicular to the first direction and parallel with the upper surface of the substrate, guide patterns disposed atop the gate structures, respectively, a source/drain region, two of the gate structures that are adjacent one another in the first direction being located on opposite sides of the source/drain region, an active contact electrically connected to the source/drain region, and a gate isolation insulating layer. Each of the guide patterns extends longitudinally in the second direction and having inclined side surfaces, and a width in the first direction of an upper portion each of the guide patterns being less than a width in the first direction of a lower portion of the guide pattern. An upper portion of the active contact interposed between opposing ones of the inclined side surfaces of two of the guide patterns respectively disposed on the two of the gate structures that are adjacent one another in the first direction. The gate isolation insulating layer extends longitudinally in the first direction on the substrate and contacts one end of the plurality of gate structures. And at least one of the guide patterns extends longitudinally in the second direction on the gate isolation insulating layer.

According to another aspect of the inventive concept, there is provided an integrated circuit device including a substrate having a fin-type active region that extends longitudinally in a first direction parallel to an upper surface of the substrate, a gate structure that intersects the fin-type active region on the substrate, extends longitudinally in a second direction that is perpendicular to the first direction and parallel to the upper surface of the substrate, and includes a gate electrode and a gate spacer disposed on both side surfaces of the gate electrode, a guide pattern that is disposed atop the gate structure and extends longitudinally in the second direction, source/drain regions disposed to both sides of the gate structure, and a first contact electrically connected to one of the source/drain regions. the guide pattern having an inclined side surface. A width of an upper portion of the guide pattern is smaller than a width of a lower portion of the guide pattern. The first contact has a lower portion contacting a side of the gate spacer, and an upper portion contacting the inclined side surface of the guide pattern.

According to another aspect of the inventive concept, there is provided an integrated circuit device including a substrate having a fin-type active region that extends longitudinally in a first direction parallel to an upper surface of the substrate, a gate structure that intersects the fin-type active region on the substrate, the gate structure including a gate electrode that extends longitudinally in a second direction that is perpendicular to the first direction and parallel to an upper surface of the substrate, a guide pattern disposed atop the gate structure and extending longitudinally in the second direction, source/drain regions disposed on both sides of the gate structure, and a contact that is electrically connected to one of the source/drain regions. The guide pattern has a cross section, in a vertical plane perpendicular to the upper surface of the substrate and parallel to the first direction, that tapers in an upward direction away from the gate structure such that a width of an upper portion the guide pattern is less than a width of a lower portion of the guide pattern. The contact has an upper portion that is disposed beside the guide pattern as laterally juxtaposed therewith in the first direction and a lower portion that is disposed beside the gate structure as laterally juxtaposed therewith in the first direction, the upper portion of the contact having a cross section, in the same vertical plane as the guide pattern, that tapers in a downward direction toward the upper surface of the substrate.

According to another aspect of the inventive concept, there is provided a method of manufacturing an integrated circuit device, including forming a fin-type active region on a substrate to extend in a first direction, forming a plurality of gate structures that intersect the fin-type active region on the substrate and that extend in a second direction perpendicular to the first direction and forming an inter-gate insulating layer that fills spaces among the plurality of gate structures, forming a plurality of guide patterns that extend in the second direction and that have inclined side surfaces on the plurality of gate structures and the inter-gate insulating layer, forming an insulating interlayer on the inter-gate insulating layer to fill spaces among the plurality of guide patterns, forming a first contact hole between two adjacent gate structures among the plurality of gate structures and between two adjacent guide patterns among the plurality of guide patterns, expanding the first contact hole until the side surfaces of the two adjacent gate structures and the inclined side surfaces of the two adjacent guide pattern are exposed, and forming a first contact in the expanded first contact hole.

BRIEF DESCRIPTION OF THE DRAWINGS

The inventive concept will be more clearly understood from the following detailed description of examples thereof taken in conjunction with the accompanying drawings in which.

DETAILED DESCRIPTION

Figure 1:
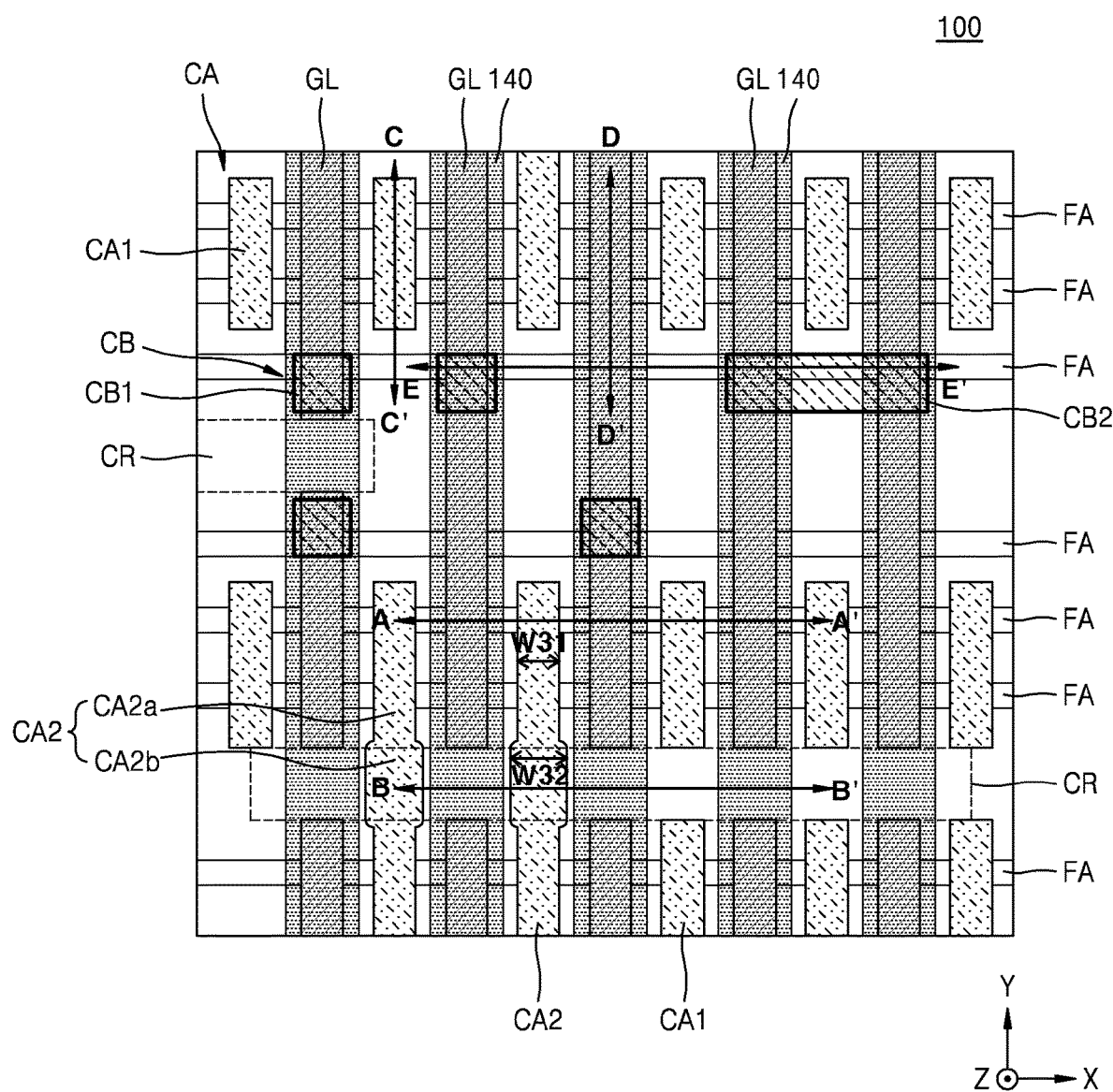
FIG. 1 is a layout diagram of examples of an integrated circuit device according to the inventive concept.

Examples of an integrated circuit device 100 according to the inventive concept will be described in detail with reference to FIGS. 1-4. Only a portion of the integrated circuit device 100 is illustrated in the figures, for convenience sake. Here and throughout the specification, individual elements may be referred to for ease of description, and such description will be understood as applying to each of a plurality of such elements as depicted in the figures. Furthermore, the term "extend" will be generally understood as referring to a lengthwise dimension or longitudinal direction of a particular element or feature, especially a linear element or feature.

Referring to FIGS. 1 to 4, a fin-type active region FA may protrude from an upper surface 110F1 of a substrate 110. The fin-type active region FA may extend in a first direction (an X direction in FIG. 1) parallel to the upper surface 110F1 of the substrate 110. As is well understood in the art, a "fin-type" region refers to an upright structure whose length is substantially greater than its width.

Examples of the substrate 110 are those including an IV group semiconductor such as Si or Ge, an IV-IV group compound semiconductor such as SiGe or SiC, or a III-V group compound semiconductor such as GaAs, InAs, or InP. Also, the substrate 110 may include a conductive region well doped with impurities or a structure doped with impurities. The fin-type active region FA may be an active region that constitutes a p-channel metal oxide semiconductor (PMOS) transistor or an n-channel metal oxide semiconductor (NMOS) transistor.

An isolation layer 112 that covers lower portions of both side surfaces of the fin-type active region FA may be disposed on the upper surface 110F1 of the substrate 110. On the fin-type active region FA and the isolation layer 112, a gate structure 120 may be disposed to extend in a second direction (Y direction of FIG. 2) in parallel with the upper surface 110F1 of the substrate 110 and perpendicular to the first direction. The gate structure 120 may include gate electrodes 122, gate insulating layers 124, gate capping layers 126, and gate spacers 128.

Each gate electrode 122 may correspond to a respective gate line GL extending in the second direction (the Y direction in FIG. 1). The gate electrodes 122 may include doped polysilicon, a metal, or a combination thereof. For example, the gate electrodes 122 may include aluminium (Al), copper (Cu), titanium (Ti), tantalum (Ta), tungsten (W), molybdenum (Mo), TaN, NiSi, CoSi, TiN, Wn, TiAl, TiAlN, TaCN, TaC, TaSiN, TiAlC, or a combination of any of the above metals. However, the inventive concept is not limited thereto. The gate electrodes 122 may include a work function metal containing layer and a gap fill metal layer. The work function metal containing layer may include at least one metal among Ti, W, ruthenium (Ru), niobium (Nb), Mo, hafnium (Hf), nickel (Ni), cobalt (Co), platinum (Pt), ytterbium (Yb), terbium (Tb), dysprosium (Dy), erbium (Er), and palladium (Pd). The gap fill metal layer may include a W layer or an Al layer. The gate electrode 122 may include a stacking structure of TiAlC/TiN/W, a stacking structure of TiN/TaN/TiAlC/TiN/W or a stacking structure of TiN/TaN/TiN/TiAlC/TiN/W. However, the inventive concept is not limited thereto.

Each gate insulating layer 124 may extend in the second direction on a bottom surface and a side surface of the gate electrode 122. The gate insulating layer 124 may be interposed between the gate electrode 122 and the fin-type active region FA and between the gate electrode 122 and an upper surface of the isolation layer 112. The gate insulating layer 124 may include a silicon oxide layer, a silicon oxynitride layer, a high-k dielectric layer having a dielectric constant higher than that of a silicon oxide layer, or a combination of any of the above layers. The high-k dielectric layer may include a metal oxide or a metal oxynitride. The high-k dielectric layer that may be used as the gate insulating layers 124 may include $HfO_2$, HfSiO, HfSiON, HfTaO, HfTiO, HfZrO, a zirconium oxide, an aluminium oxide, an $HfO_2$—$Al_2O_3$ alloy, or a combination of any of the above materials. However, the inventive concept is not limited thereto.

Each gate capping layer 126 may be disposed on a gate electrode 122. The gate capping layer 126 may extend in the second direction (the Y direction in FIG. 2) while covering an upper surface of the gate electrode 122. In examples, the gate capping layer 126 includes a silicon nitride.

Each gate spacer 128 may extend over both sides of the gate electrode 122 and both sides of the gate capping layer 126. The gate spacer 128 may extend in an extension direction of the gate electrode 122 on both side surfaces of the gate electrode 122. The gate insulating layer 124 may be interposed between the gate electrode 122 and the gate spacer 128. In examples, the gate spacer 128 may include $SiO_x$, $SiN_x$, $SiO_xN_y$, $SiC_xN_y$, $SiO_xC_yN_z$, or a combination of any of the above materials.

Figure 2:
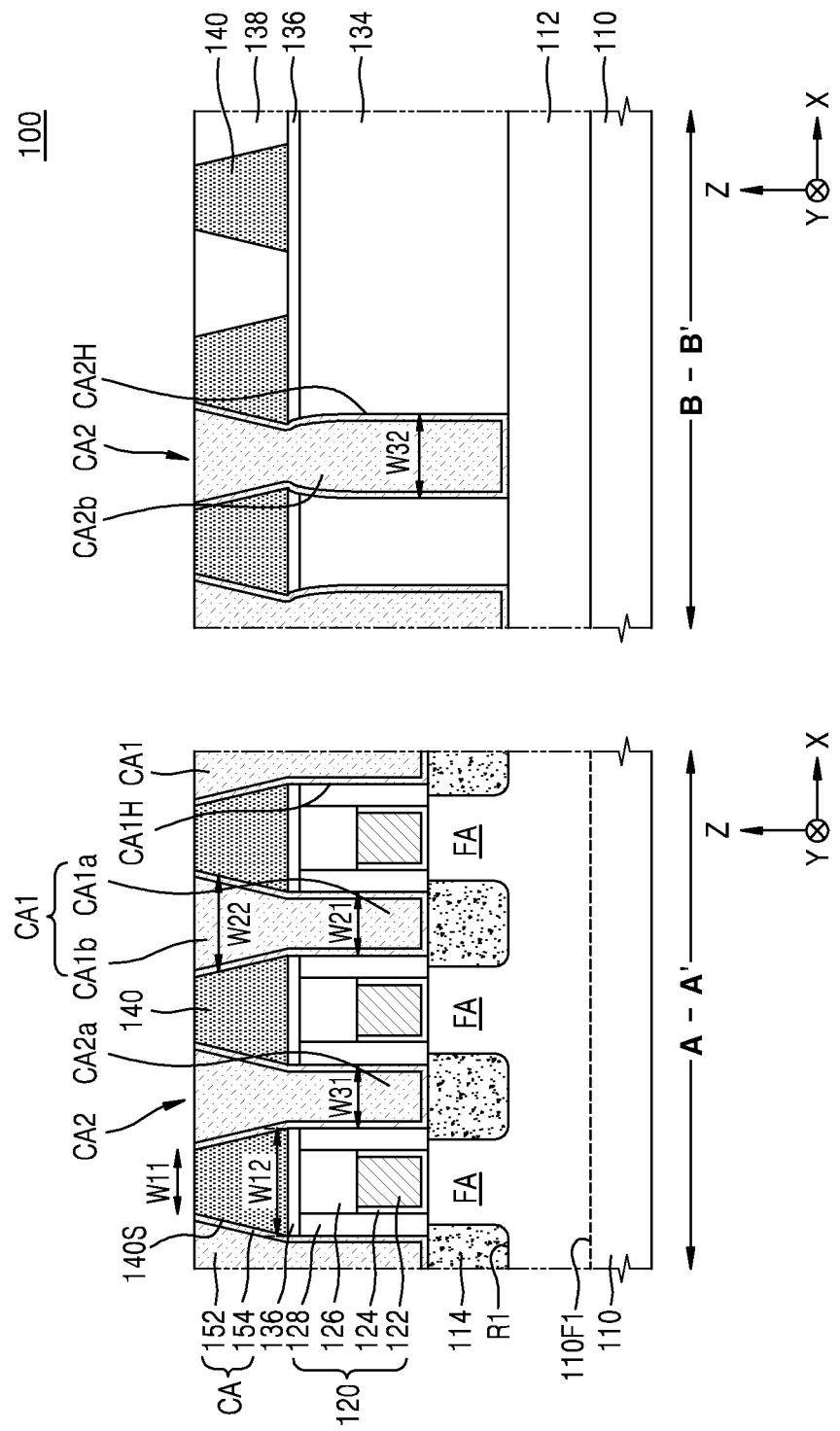
FIG. 2 is a cross-sectional view taken along line A-A' and line B-B' of FIG. 1.

FIG. 2 illustrates an example in which the gate spacer consists of a single layer. In other examples, the gate spacer 128 includes a plurality of layers of different materials. For instance, the gate spacer 128 may include a first spacer layer, a second spacer layer, and a third spacer layer that are sequentially stacked on the side surface of the gate electrode 122. In examples, the first spacer layer and the third spacer layer may include silicon nitride, silicon oxide, or silicon oxynitride. The second spacer layer may include an insulating material with a dielectric constant lower than that of the first spacer layer. In still another example, the second spacer layer may be an air space.

Figure 3:
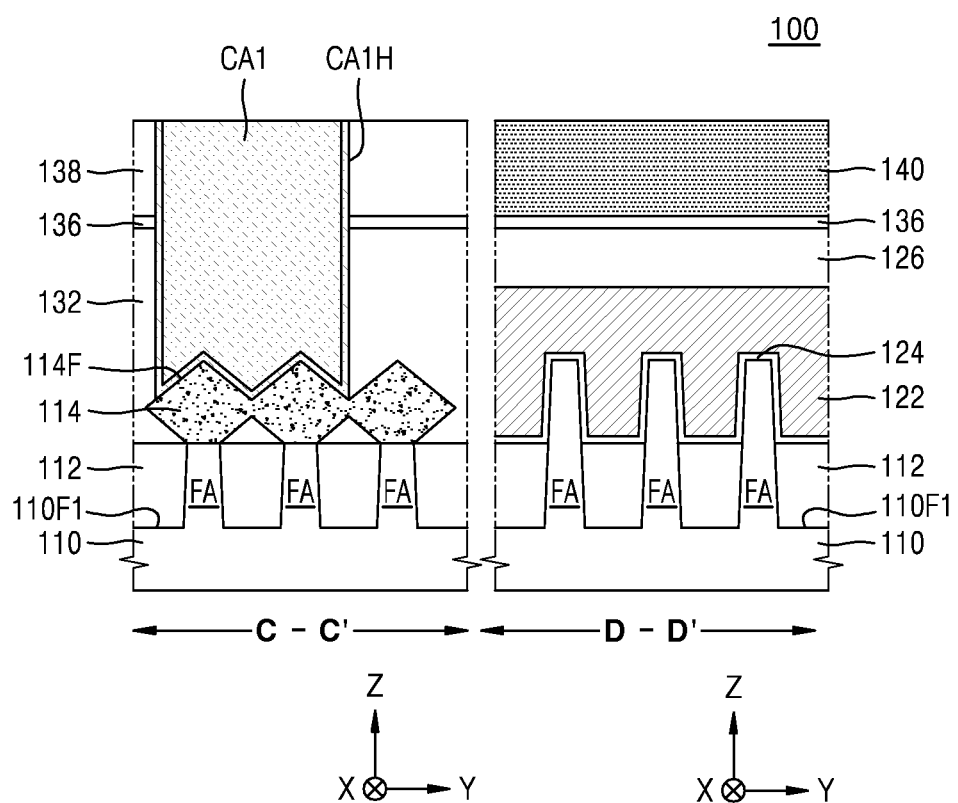
FIG. 3 is a cross-sectional view taken along line C-C' and line D-D' of FIG. 1.

A source/drain region 114 may be disposed in the fin-type active region FA on both sides of the gate structure 120. The source/drain region 114 may include a doped SiGe layer, a doped Ge layer, a doped SiC layer, or a doped InGaAs layer. However, the inventive concept is not limited thereto. The source/drain region 114 may be formed by removing a portion of the fin-type active region FA on both sides of the gate structure 120 to form a recess R1 and growing a semiconductor layer that fills the recess R1 by an epitaxial process. In examples, as illustrated in FIG. 3, the source/drain region 114 may have a polygonal shape having a plurality of inclined surfaces 114F.

For example, when the fin-type active region FA is an active region for the NMOS transistor, the source/drain region 114 may include doped SiC and, when the fin-type active region FA is an active region for the PMOS transistor, the source/drain region 114 may include doped SiGe.

In addition, the source/drain region 114 may include a plurality of semiconductor layers with different compositions. In an example, the source/drain region 114 includes a lower semiconductor layer (not shown), an upper semiconductor layer (not shown), and a capping semiconductor layer (not shown) that sequentially fill the recess R1. The lower semiconductor layer, the upper semiconductor layer, and the capping semiconductor layer may each include SiGe and an amount of Si and/or an amount of Ge may be different from each other.

Figure 4:
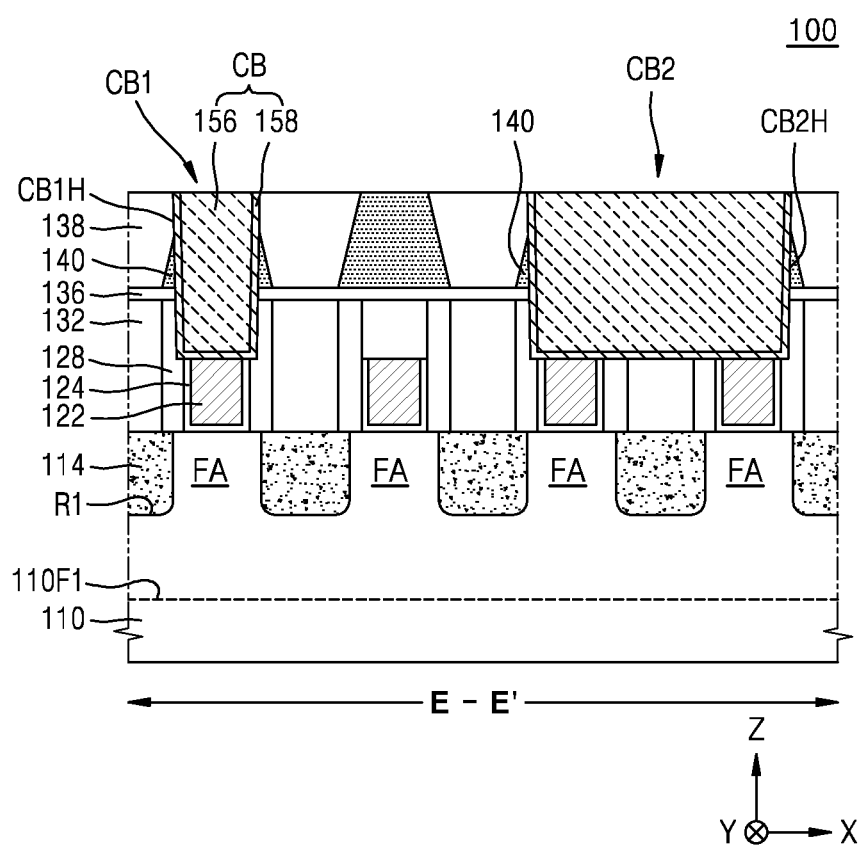
FIG. 4 is a cross-sectional view taken along line E-E' of FIG. 1.

As illustrated in FIG. 4, an inter-gate insulating layer 132 that covers the source/drain region 114 may be disposed between the gate structure 120 and a neighbouring gate structure 120. The inter-gate insulating layer 132 may include silicon nitride, silicon oxide, or silicon oxynitride.

As illustrated in FIG. 1, the gate lines GL may be separated from each other at uniform intervals in the first direction and extend in the second direction. The gate lines GL may be separated from each other at uniform intervals in the second direction (the Y direction) with a gate cut region CR interposed between them. FIG. 1 illustrates an example in which the gate cut region CR extends in the first direction (the X direction) so as to meet five successively disposed gate lines GL. However, the inventive concept is not limited thereto. The length of the gate cut region CR may vary depending on desired specifications for the integrated circuit device 100.

A gate isolation insulating layer 134 may be disposed in the gate cut region CR. The gate isolation insulating layer 134 may be disposed to contact one end of the gate structure 120. The gate isolation insulating layer 134 may have an upper surface at the same level as an upper surface of the gate structure 120. The gate isolation insulating layer 134 may include silicon nitride, silicon oxide, or silicon oxynitride.

An etch stop layer 136 may be disposed on the gate structure 120, the inter-gate insulating layer 132, and the gate isolation insulating layer 134. The etch stop layer 136 may include silicon nitride, silicon oxide, or silicon oxynitride.

Guide patterns 140 may be disposed on the etch stop layer 136. As illustrated in FIG. 1, the guide patterns 140 may be respectively disposed on the plurality of gate lines GL and may each extend in the second direction (the Y direction).

The guide patterns 140 may overlap the gate cut region CR. The guide patterns 140 may extend in the second direction on the gate isolation insulating layer 134.

Each guide pattern 140 may have a cross section, in a vertical plane perpendicular to the upper surface of the substrate and parallel to the first direction (the X-Z plane in the figures), that tapers in an upward direction away from the gate structure 120 such that a width of an upper portion the guide pattern 140 is less than a width of a lower portion of the guide pattern.

To this end, each guide pattern 140 may include a pair of inclined side surfaces 140S that extend in the second direction (the Y direction). The pair of inclined side surfaces 140S may be inclined with respect to the upper surface 110F1 of the substrate 110 at a first tilt angle and the first tilt angle may be smaller than about 80°. The inclined surfaces in this example are planar surfaces but the term "inclined surface" is not limited to describing a planar surface. Rather, the term "inclined surface" may refer to a surface having a slope that is not vertical.

A first width W11 of an upper surface of the guide pattern 140 in the first direction may be less than a second width W12 of a bottom surface of the guide pattern 140 in the first direction. Bottoms of the pair of inclined side surfaces 140S may be aligned with outer side surfaces of the gate spacer 128 with the etch stop layer 136 interposed therebetween. That is, the second width W12 of the bottom surface of the guide pattern 140 may be equal to a width of the gate structure 120 in the first direction and the guide pattern 140 may overlap, i.e., may be vertically juxtaposed with, the gate structure 120. Here and in the description that follows, the term "width" will refer to the dimension perpendicular to the lengthwise or longitudinal dimension of the element or feature. Thus, in this example, the width of the guide pattern 140 refers to a dimension of the guide pattern 140 in the first (X) direction.

The guide pattern 140 may include silicon nitride, silicon oxide, or silicon oxynitride. The guide pattern 140 may include a material having etch selectivity with respect to the etch stop layer 136 and/or the inter-gate insulating layer. In an example, each of the etch stop layer 136 and the inter-gate insulating layer 132 includes silicon oxide and the guide pattern 140 includes silicon nitride.

An insulating interlayer 138 may be disposed on the etch stop layer 136 and the guide pattern 140. The insulating interlayer 138 may contact the inclined side surfaces 140S of the guide pattern 140. The insulating interlayer 138 may include silicon nitride, silicon oxide, silicon oxynitride, a tetraethyl orthosilicate (TEOS) layer, or an ultralow K (ULK) layer having a dielectric constant of about 2.2 to about 2.4.

An active contact CA is disposed on the source/drain region 114 and a gate contact CB may be disposed on the gate structure 120.

The active contact CA may include an active contact plug 152 and a conductive barrier layer 154. In examples, the active contact plug 152 include at least one of Co, W, Ni, Ru, Cu, Al, a silicide of any of the above metals, or an alloy of any of the above metals. For example, the active contact plug 152 may be of Co. The conductive barrier layer 154 may be disposed to surround the active contact plug 152 in its circumferential direction. The conductive barrier layer 154 may be interposed between the active contact plug 152 and the gate spacer 128, between the active contact plug 152 and the guide pattern 140, and between the active contact plug 152 and the source/drain region 114. The conductive barrier layer 154 may include Ti, Ta, TiN, TaN, or a combination of any of the above materials.

According to an example, each active contact CA includes first and second portions referred to hereinafter as a first contact CA1 and a second contact CA2, respectively. The first contact CA1 may be disposed on the source/drain region 114 between the two adjacent gate structures 120. The second contact CA2 may extend from the two adjacent gate structures 120 onto one side of the gate isolation insulating layer 134 in the second direction.

The first contact CA1 may in turn include a first part CA1*a* at a lower level than the upper surface of the gate structure 120 and a second part CA1*b* at a higher level than the first portion. A side surface of the first part CA1*a* of the first contact CA1 may contact the gate spacer 128 and may extend perpendicular to the upper surface 110F1 of the substrate 110, i.e., the lower first part CA1*a* may be disposed beside the gate structure 120 as laterally juxtaposed therewith in the first direction. A side surface of the second part CA1*b* of the first contact CA1 may contact the guide pattern 140 and may be inclined with respect to the upper surface 110F1 of the substrate 110 to conform or correspond, i.e., to extend parallel, to the inclined side surface 140S of the guide pattern 140. Thus, the upper second part CA1*b* may be disposed beside the guide pattern 140 as laterally juxtaposed therewith in the first direction. The side surface of the second part CA1*b* of the first contact CA1 may be inclined with respect to the upper surface 110F1 of the substrate 110 at a tilt angle of less than 80°. Therefore, the second part CA1*b* (upper portion) of the first contact CA1 may have a cross section in the X-Z plane that tapers in a downward direction toward the upper surface 110F1 of the substrate 110.

As illustrated in FIG. 2, the side surface of the first portion CA1*a* of the first contact CA1 and the side surface of the second portion CA1*b* of the first contact CA1 may be connected without undergoing a sharp change in their slopes (which state may be referred to hereinafter as "gently connected"). That is, according to an aspect of the inventive concept, the region of the first contact CA1 where the side surface of the first portion CA1*a* and the side surface of the second portion CA1*b* meet does not include a stepped portion, a protrusion, or a kink. Because the bottom of the inclined side surface 140S of the guide pattern 140 is aligned with the side surface of the gate spacer 128, the side surface of the first portion CA1*a* that contacts the gate spacer 128 may be continuously connected with the side surface of the second portion CA1*b* that contacts the inclined side surface 140S.

As illustrated in FIG. 2, the first portion CA1*a* of the first contact CA1 has a first width W21 and the second portion CA1*b* of the first contact CA1 has a second width W22 and the second width W22 may be larger than the first width W21. That is, the first contact CA1 may have a profile in which an upper width (for example, the second width W22) is larger than a lower width (for example, the first width W21).

In cases in which the first contact CA1 is formed by filling a first contact hole CA1H with a metal material such as Co, when a width of the first contact hole CA1H is small and/or a kink that includes a rapid change in slope in the side surface is formed on the side surface of the first contact hole CA1H, the metal material may not completely fill the first contact hole CA1H or quality of the metal material may not be high. However, according to examples of the inventive concept, the first contact hole CA1H has a profile in which an upper width of the first contact hole CA1H is larger than a lower width of the first contact hole CA1H and the side surface of the first contact hole CA1H is gently connected without a kink. Therefore, the metal material completely fills the first contact hole CA1H or quality of the first contact CA1 formed in the first contact hole CA1H may be high.

The second contact CA2 may be disposed on the source/drain region 114 between the two adjacent gate structures 120, extend in the second direction, and may contact the gate isolation insulating layer 134. As illustrated in FIG. 1, in a plan view, the second contact CA2 is disposed between two gate lines GL spaced apart from each other in the first direction (the X direction) and between two gate lines GL spaced apart from the two gate lines GL in the second direction (the Y direction) and the second contact CA2 overlaps the gate cut region CR.

The second contact CA2 may include a third part CA2*a* that faces or contacts the side surface of the gate structure 120 and a fourth part CA2*b* that faces or contacts the gate isolation insulating layer 134. A first width W31 of the third par CA2*a* of the second contact CA2 may be smaller than a second width W32 of the fourth part CA2*b* of the second contact CA2.

In an example, the first contact CA1 and the second contact CA2 are formed by forming the contact holes CA1H and CA2H that expose a portion of an upper surface of the source/drain region 114, expanding the contact holes CA1H and CA2H, and filling a metal material in the expanded contact holes CA1H and CA2H. In a process of extending the contact holes CA1H and CA2H, due to a difference in etch rate between the gate spacer 128 and the gate isolation insulating layer 134, more of the gate isolation insulating layer 134 may be removed. Therefore, the second width W32 of the fourth part CA2*b* of the second contact CA2 may be larger than the first width W31 of the third part CA2*a* of the second contact CA2.

Each gate contact CB may include a gate contact plug 156 and a conductive barrier layer 158. The gate contact plug 156 may include Co, W, Ni, Ru, Cu, Al, a silicide of any of the above metals, or an alloy of any of the above metals. In an example, the gate contact plug 156 is of Co. The conductive barrier layer 158 may surround the gate contact plug 156 in its circumferential direction. The conductive barrier layer 154 may be interposed between the gate contact plug 156 and the gate spacer 128, between the gate contact plug 156 and the gate electrode 122, and the gate contact plug 156 and the guide pattern 140. The conductive barrier layer 158 may include Ti, Ta, TiN, TaN, or a combination of any of the above metals.

According to examples, the gate contact CB may include a third contact CB1 and a fourth contact CB2. The third contact CB1 may be disposed on the gate structure 120 as passing through the guide pattern 140. The fourth contact CB2 may be disposed on the gate structure 120 and a neighbouring gate structure 120 adjacent to the gate structure 120. A portion of a side surface of the fourth contact CB2 may be surrounded by the guide pattern 140. As exemplarily illustrated in FIG. 1, in a plan view, the third contact CB1 overlaps one gate line GL and the fourth contact CB2 overlaps two gate lines GL separate in the first direction (the X direction) and the inter-gate insulating layer 132 between the two gate lines GL.

Selectively, a silicide layer (not shown) may be formed between the source/drain region 114 and the active contact CA. The silicide layer may include a metal silicide such as Co silicide, Ni silicide, or W silicide.

A via (not shown) and an upper wiring line (not shown) may be formed on the guide pattern 140 and the insulating interlayer 138. The via may be disposed between the active contact CA and the upper wiring line or between the gate contact CB and the upper wiring line. The upper wiring line may include a stacking structure of a plurality of wiring line layers at different levels. An upper insulating interlayer (not shown) that surrounds the via and the upper wiring line may be further formed.

According to the above-described integrated circuit device 100, the guide pattern 140 having the inclined side surface 140S may be disposed on the gate structure 120 and the first contact CA1 that contacts the gate structure 120, and the guide pattern 140 may have a an upper portion more narrow than a lower portion and an upper side surface gently connected to a lower side surface. Therefore, in a process of filling the first contact hole CA1H with a metal material, the metal material may completely fill the first contact hole CA1H or a film quality of the first contact CA1 formed in the first contact hole CA may be high. Therefore, the size of the first contact CA1 may be minimal and yet may provide a reliable electric connection.

Figure 5:
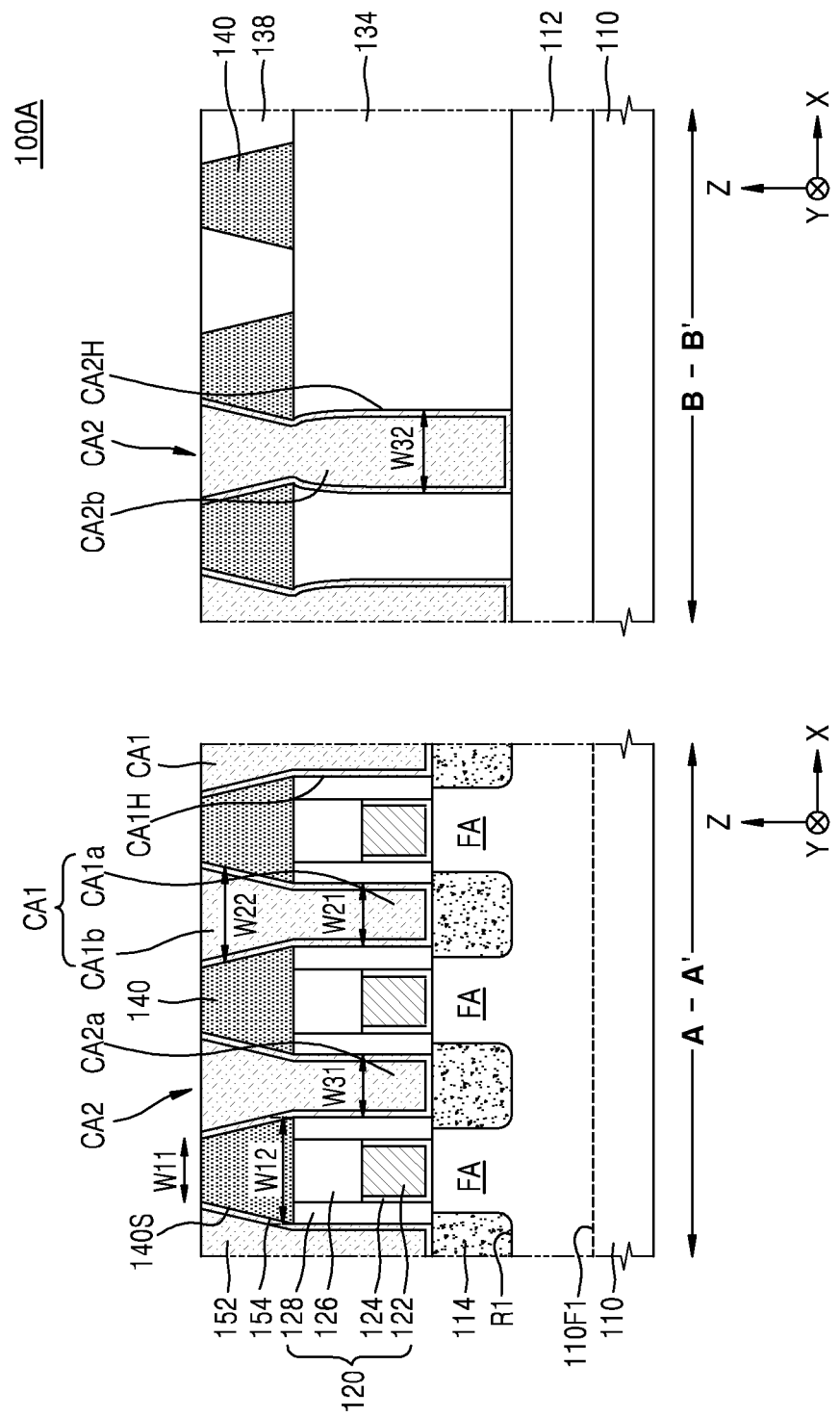
FIGS. 5 and 6 are cross-sectional views of an example of an integrated circuit device according to the inventive concept.
Figure 6:
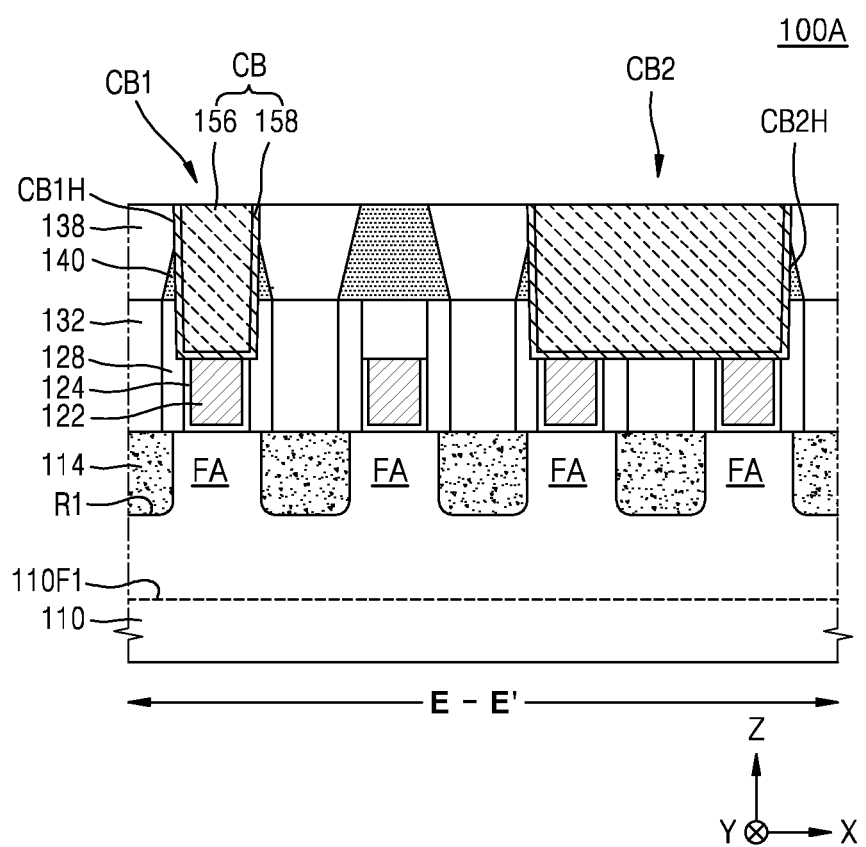

Other examples of an integrated circuit device 100A according to the inventive concept will now be described in detail with reference to FIGS. 5 and 6. In FIGS. 5 and 6, elements that are the same as those in FIGS. 1 to 4 are denoted by like reference numerals. The integrated circuit device 100A of FIGS. 5 and 6 is similar to the integrated circuit device 100 described in FIGS. 1 to 4 except in that the etch stop layer 136 is not formed.

Referring to FIGS. 5 and 6, the guide pattern 140 may be disposed directly on the gate structure 120. A bottom surface of the guide pattern 140 may contact an upper surface of the gate capping layer 126 and an upper surface of the gate spacer 128.

The first portion CA1a of the first contact CA1 contacts the gate spacer 128 and may extend perpendicularly to the upper surface 110F1 of the substrate 110. The second portion CA1b of the first contact CA1 contacts the inclined side surface 140S of the guide pattern 140 and may be inclined with respect to the upper surface 110F1 of the substrate 110 at a first tilt angle of less than about 80°. The second width W12 of the bottom of the guide pattern 140 may be substantially the same as the width of the gate structure 120 and a bottom surface of the inclined side surface 140S may be aligned with a side surface of the gate structure 120. Therefore, a side surface of the first portion CA1a of the first contact CA1 and a side surface of the second portion CA1b may be gently connected without a kink that provides a rapid change in slope at the point of transition between the side surfaces of the first portion and second portions CA1b and CA1a of the first contact CA1.

Figure 7:
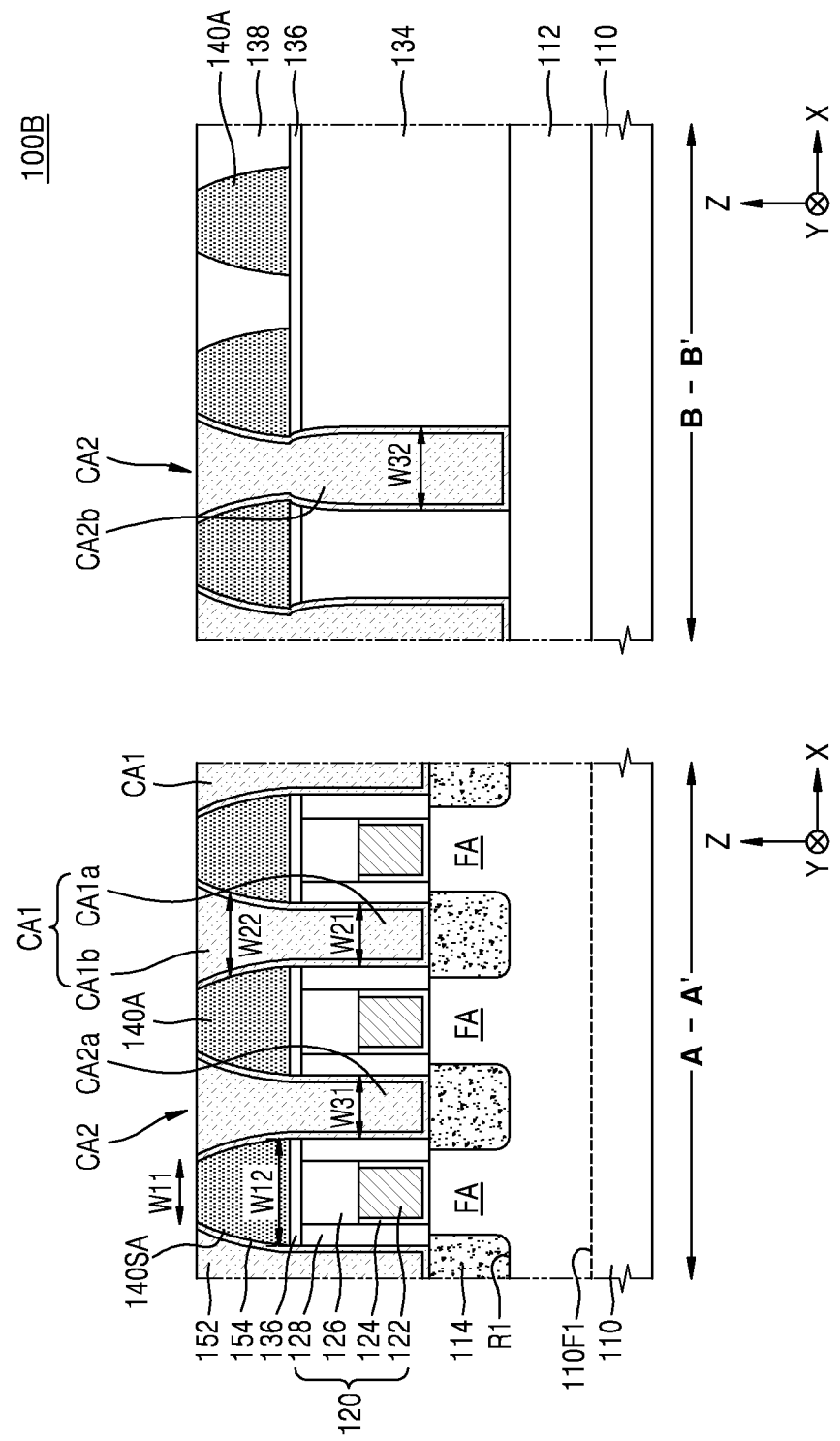
FIG. 7 is a cross-sectional view of an example of an integrated circuit device according to the inventive concept.

FIG. 7 illustrates another example of an integrated circuit device 100B according to the inventive concept. In FIG. 7, elements that are the same as those in FIGS. 1 to 6 are denoted by like reference numerals. The integrated circuit device 100B of FIG. 7 is similar to the integrated circuit device 100 described in FIGS. 1 to 4 except for the shape of the guide pattern 140A.

Referring to FIG. 7, a guide pattern 140A may include a pair of inclined side surfaces 140SA extending in the second direction (the Y direction). In the guide pattern 140A, a width W12 of a lower portion of the guide pattern 140A may be larger than a width W11 of an upper portion. At least a portion of each of inclined side surfaces 140SA may be a curved (convex) surface. The pair of inclined side surfaces 140SA may be disposed so that a slope with respect to the upper surface 110F1 of the substrate 110 is gradually reduced. The side surface of the first portion CA1a of the first contact CA1 may be gently connected to the side surface of the second portion CA1b of the first contact CA1 that contacts the inclined side surface 140SA. The side surface of the second portion CA1b of the first contact CA1 may be a concave surface complementary to the side surface 140SA. Thus, similar to the previous example, the guide pattern 140A has a cross section, in a vertical plane perpendicular to the upper surface of the substrate and parallel to the first direction (the X-Z plane in the figures), that tapers in an upward direction away from the gate structure 120.

According to the above-described integrated circuit device 100B, in a process of forming the first contact CA1 by filling the first contact hole CA1H with a metal material, the metal material may completely fill the first contact hole CA1H or a film quality of the first contact CA1 formed in the first contact hole CA1H may be high. Therefore, the size of the first contact CA1 may be minimal and yet may provide a reliable electric connection.

Figure 8:
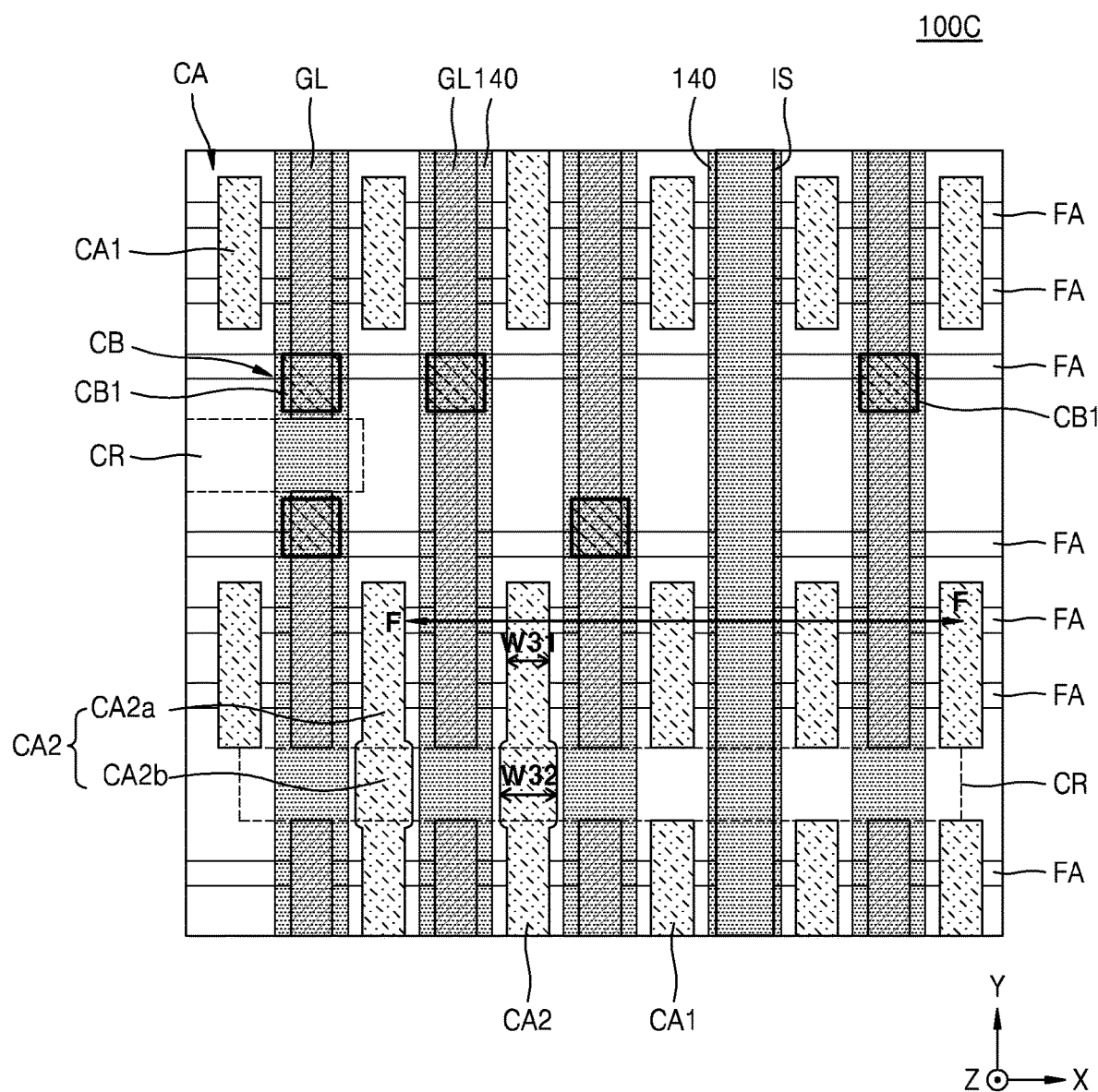
FIG. 8 is a layout diagram of examples of an integrated circuit device according to the inventive concept.
Figure 9:
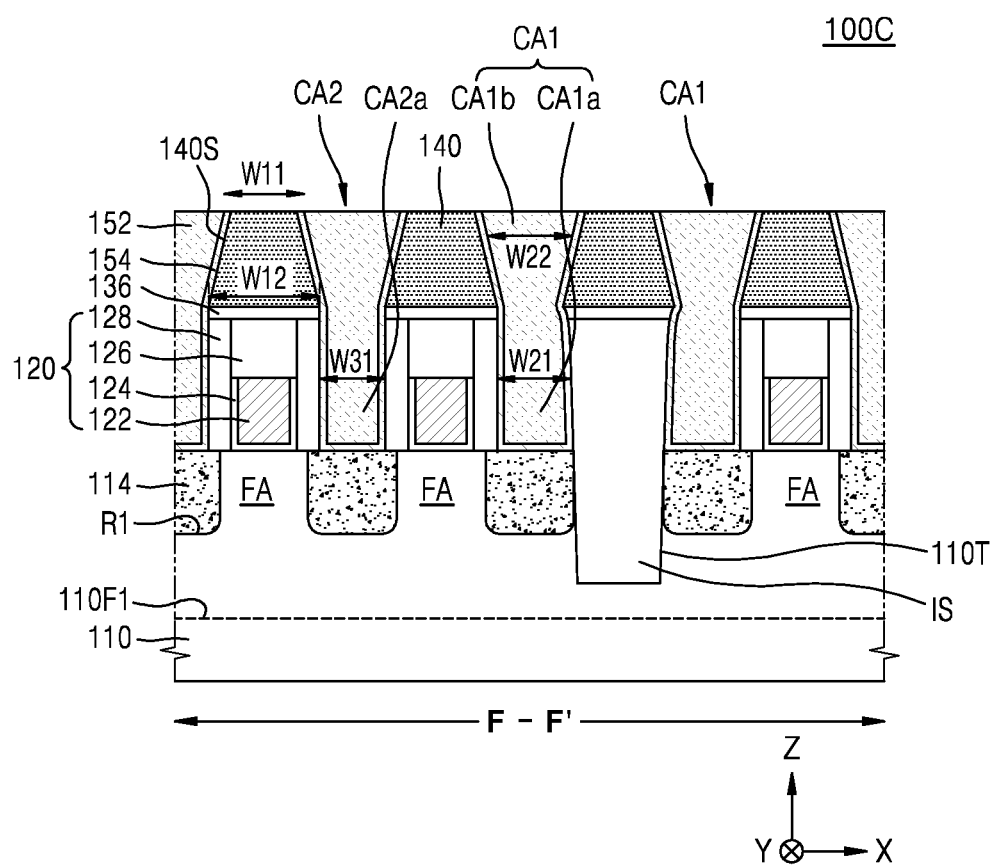
FIG. 9 is a cross-sectional view taken along line F-F' of FIG. 8.

FIG. 8 is a layout diagram of other examples of an integrated circuit device 100C according to the inventive concept. FIG. 9 is a cross-sectional view taken along line F-F' of FIG. 8. In FIG. 8, only part of the integrated circuit device 100C is illustrated for convenience sake.

Referring to FIGS. 8 and 9, an isolation structure IS may extend at one side of the plurality of gate lines GL in the second direction (the Y direction). The isolation structure IS may be formed at one side of the gate structure 120 on an internal surface of a trench 110T formed in the fin-type active region FA. The isolation structure IS may include silicon oxide, silicon nitride, or silicon oxynitride.

FIG. 9 illustrates that the isolation structure IS is formed of a single layer. However, the isolation structure IS may instead include a stacking structure including a plurality layers. For example, the isolation structure IS may include an interface layer (not shown) conformally formed on the internal surface of the trench 110T and a burial insulating layer (not shown) that fills the trench 110T on the interface layer. According to another example, the isolation structure IS includes a lower burial layer (not shown) that fills the trench 110T and has an upper surface at a level similar to that of the upper surface of the fin-type active region FA and an upper burial layer (not shown) disposed on the lower burial layer and having an upper surface at a level similar to that of the upper surface of the gate structure 120. According to another example, the isolation structure IS includes a pair of insulating spacers (not shown) that extend in the second direction (the Y direction) while covering an upper surface and both side surfaces of the fin-type active region FA and a burial insulating layer (not shown) that fills the trench 110T between the pair of insulating spacers and the extends in the second direction. However, the isolation structure IS is not limited to any of these particular examples.

On the isolation structure IS, the guide pattern 140 may extend in the second direction. In the plan view illustrated in FIG. 8, the plurality of gate lines GL are spaced from each other in the first direction at uniform intervals. One of the plurality of gate lines GL and the isolation structure IS adjacent to the gate line GL may be spaced from each other at the same interval as the intervals at which the plurality of gate lines GL are spaced from each other. The guide pattern 140 may overlap the plurality of gate lines GL and the isolation structure IS.

FIGS. 10 to 18 illustrate a method of manufacturing an integrated circuit device according to the inventive concept. In FIGS. 10 to 18, cross sections corresponding to the cross sections taken along the line A-A' and the line B-B' of FIG. 1 are illustrated in a process order. In FIGS. 10 to 18, elements similar to those in FIGS. 1 to 9 are denoted by like reference numerals.

Figure 10:
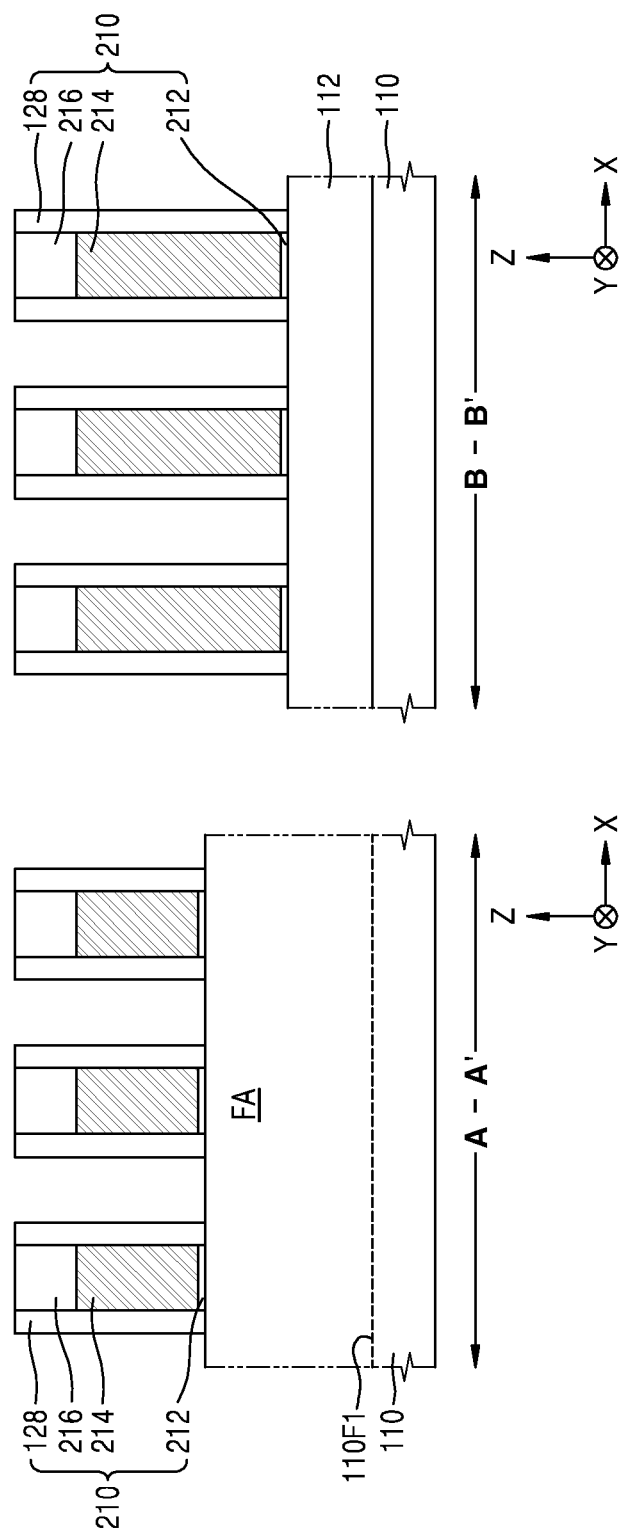
FIGS. 10, 11, 12, 13, 14, 15, 16, 17 and 18 are cross-sectional views of an integrated circuit device during the course of its manufacture and together illustrate an example of a method of manufacturing the integrated circuit device according to the inventive concept.

Referring to FIG. 10, the fin-type active region FA that protrudes vertically from the upper surface 110F1 of the substrate 110 and extends in one direction (the X direction of FIG. 10) may be formed by etching away part of the active region of the substrate 110.

An isolation layer 112 that covers both side surfaces of the fin-type active region FA may be formed on the substrate 110. Although not shown, an interface layer (not shown) that conformally covers the side surfaces of the fin-type active region FA may be further formed on the fin-type active region FA so as to be interposed between the isolation layer 112 and the fin-type active region FA.

A sacrificial gate 214 and a sacrificial gate insulating layer pattern 212 may be formed by sequentially forming a sacrificial gate insulating layer (not shown), a sacrificial gate conductive layer (not shown), and a hard mask pattern 216 on the substrate 110 and patterning the sacrificial gate conductive layer and the sacrificial gate insulating layer by using the hard mask pattern 215 as an etching mask The gate spacers 128 may be formed on side surfaces of the hard mask pattern 216, the sacrificial gate 214, and the sacrificial gate insulating layer pattern 212 by forming a spacer insulating layer (not shown) that covers the hard mask pattern 216, the sacrificial gate 214, and the sacrificial gate insulating layer pattern 212 by using an atomic layer deposition (ALD) process or a chemical vapor deposition (CVD) process and performing an anisotropic etching process on the spacer insulating layer. In an example, the gate spacer 128 is formed of silicon nitride. However, the inventive concept is not limited thereto.

Hereinafter, the sacrificial gate insulating layer pattern 212, the sacrificial gate 214, the hard mask pattern 216, and the gate spacer will be collectively referred to as a sacrificial gate structure 210.

Figure 11:
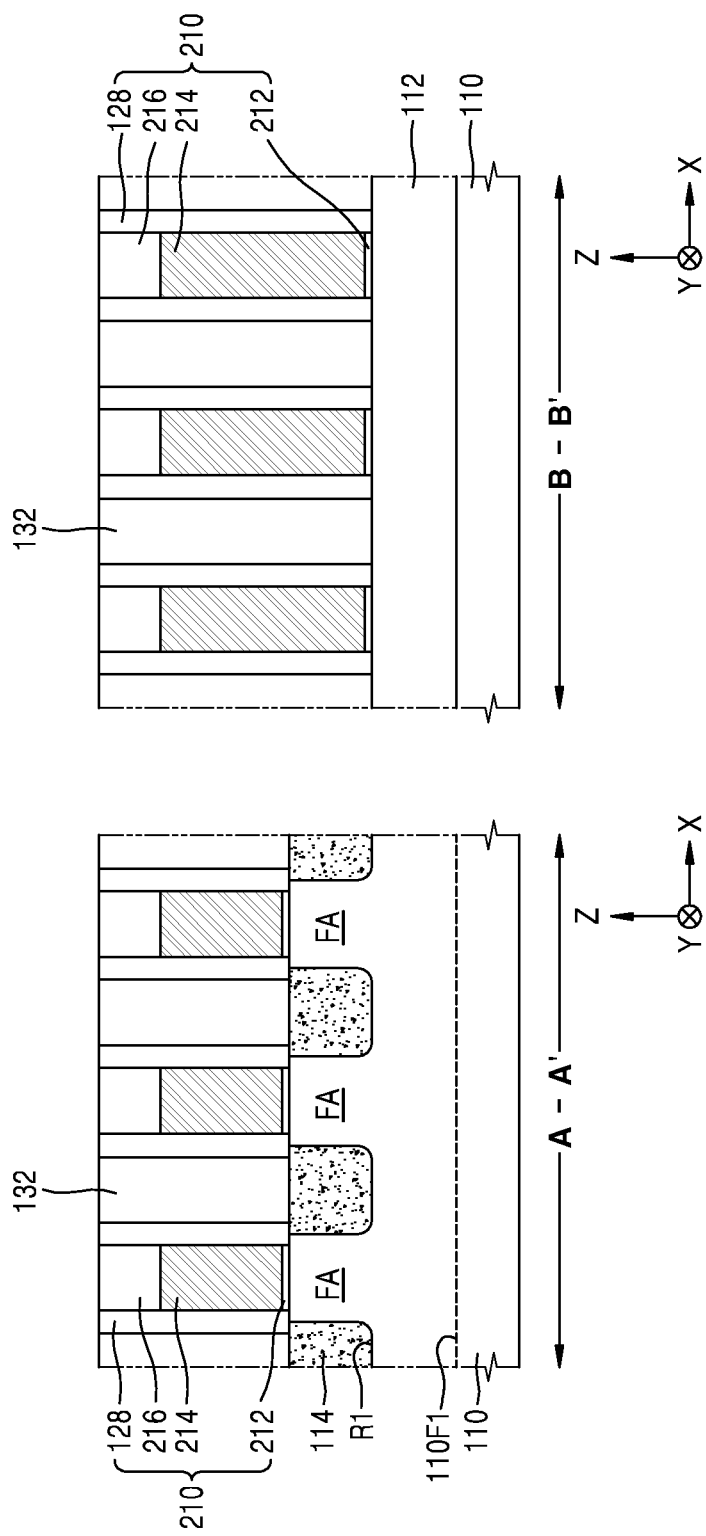

Referring to FIG. 11, the recess R1 is formed by etching a portion of the fin-type active region FA at both sides of the sacrificial gate structure 210 and the source/drain region 114 may be formed in the recess R1.

According to examples, the source/drain region 114 may be formed by an epitaxial process by using the side surface of the fin-type active region FA exposed to the recess region R1 and an upper surface of the substrate 110 as seed layers. The epitaxial process may be vapor-phase epitaxy (VPE) process, a CVD process such as ultra-high vacuum chemical vapour deposition (UHV-CVD) process, a molecular beam epitaxy process, or a combination of the above processes. In the epitaxial process, as a precursor required for forming the source/drain region 114, a liquid or gaseous precursor may be used.

The source/drain region 114 may be formed to have various shapes by controlling a growth condition in the epitaxial process. In an example, the source/drain region 114 may be formed to have the shape of a polygon in which inclined surfaces 114F (refer to FIG. 3) are formed to subtend given angles with respect to each other. However, the shape of the source/drain region 114 is not limited thereto. The source/drain region 114 may have various shapes depending on the material of the fin-type active region FA, the material of the source/drain region 114, the kind of a transistor formed on the substrate 110, and conditions of the epitaxial process.

Then, the inter-gate insulating layer 132 may be formed by forming an insulating layer (not shown) that covers the gate spacer 128 and the hard mask pattern 216 on the substrate 110 and planarizing the insulating layer until the upper surfaces of the gate spacer 128 and the hard mask pattern 216 are exposed.

Figure 12:
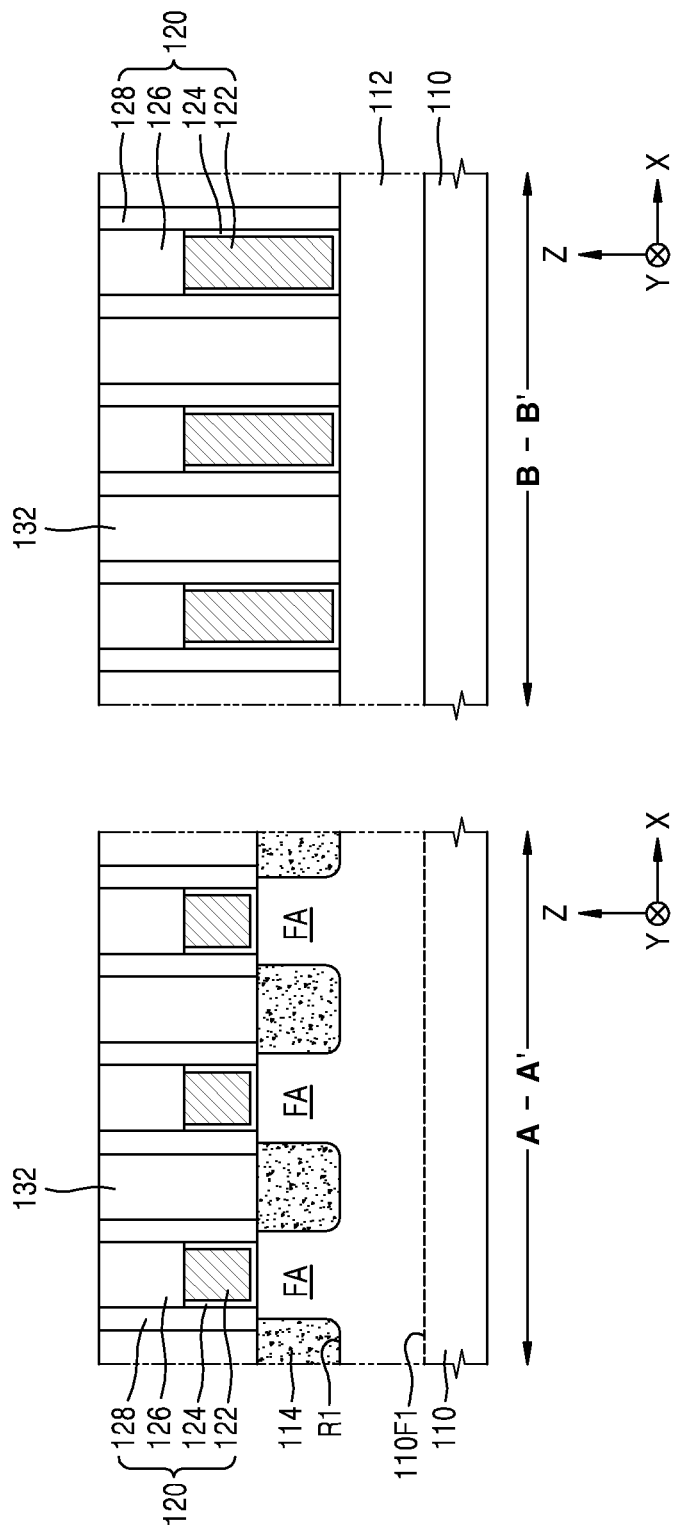

Referring to FIG. 12, a gate space (not shown) defined between the side surfaces of the gate spacer 128 is formed by removing the hard mask pattern 216 (refer to FIG. 11), the sacrificial gate 214 (refer to FIG. 11), and the sacrificial gate insulating layer pattern 212 (refer to FIG. 11). Then the gate insulating layer 124 may be formed along surfaces delimiting sides and the bottom of the gate space.

Then, the gate electrode 122 may be formed by forming a conductive layer (not shown) that fills the gate space remaining in the gate insulating layer 124 and etching an upper portion of the conductive layer. Then, the gate capping layer 126 that fills the gate space may be formed by forming an insulating layer (not shown) that fills a residual portion of the gate space on the gate electrode 122 and the inter-gate insulating layer 132 and removing an upper portion of the insulating layer until the upper surface of the inter-gate insulating layer 132 or the gate spacer 128 is exposed.

An example of a process of removing the sacrificial gate structure 210 is a wet etching process. Examples of etchant for the wet etching include $HNO_3$, DHF (diluted fluoric acid), $NH_4OH$, tetramethyl ammonium hydroxide (TMAH), KOH, or a combination of the above etchants.

Hereinafter, the gate electrode 122, the gate insulating layer 124, the gate capping layer 126, and the gate spacer 128 will be collectively referred to as the gate structure 120. In an etch back process for forming the gate structure 120, upper portions of the inter-gate insulating layer 132 and the gate spacer 128 are removed by a certain amount so that heights of the inter-gate insulating layer 132 and the gate spacer 128 may be reduced.

Figure 13:
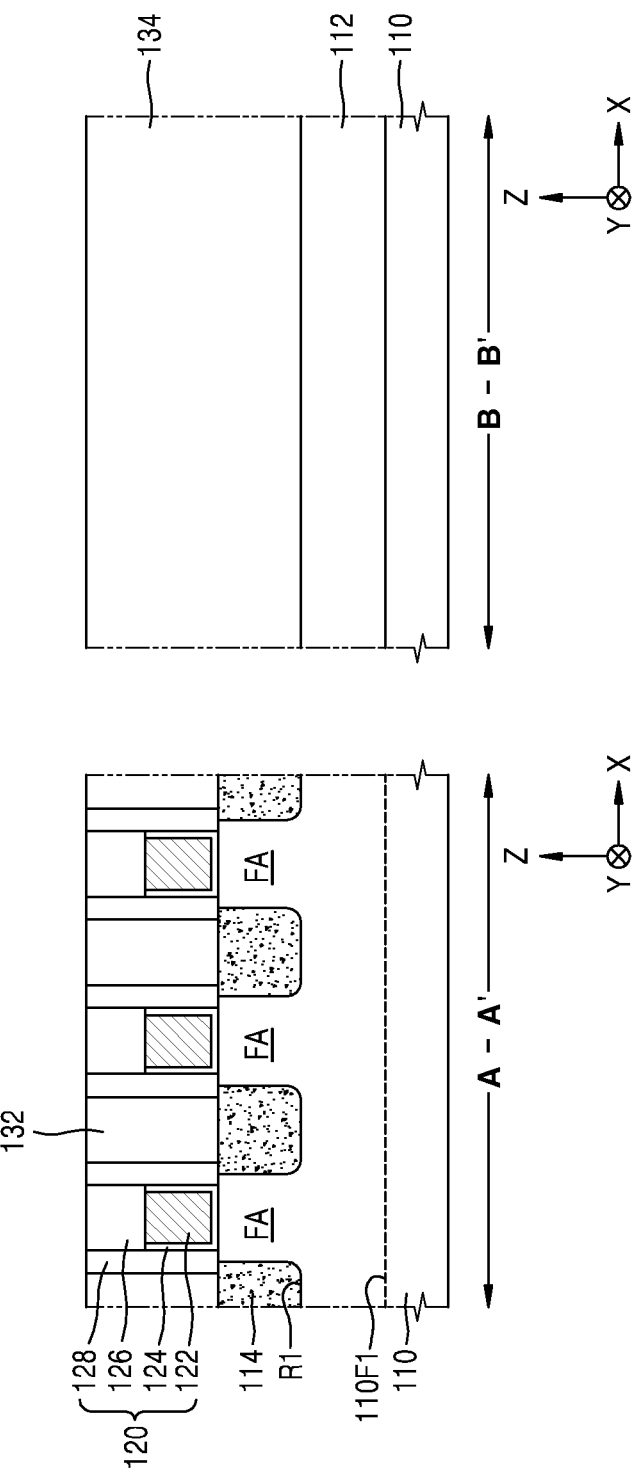

Referring to FIG. 13, a mask pattern (not shown) including an opening (not shown) that exposes the gate cut region CR (refer to FIG. 1) is formed on the gate structure 120 and the inter-gate insulating layer 132 and a portion of the gate structure 120 that overlaps the gate cut region CR may be removed by using the mask pattern as an etching mask. Then, an insulating layer (not shown) is formed so as to fill a space obtained by removing the portion of the gate structure 120 and the gate isolation insulating layer 134 may be formed by etching back an upper portion of the insulating layer.

According to another example, before the gate structure 120 is formed, the portion that overlaps the gate cut region CR is removed from the sacrificial gate structure 210 and the gate isolation insulating layer 134 that fills the removed space is formed. Then, a gate space (not shown) defined between the side surfaces of the gate spacer 128 is formed by removing the hard mask pattern 216 (refer to FIG. 11), the sacrificial gate 214 (refer to FIG. 11), and the sacrificial gate insulating layer pattern 212 and the gate insulating layer 124, the gate electrode 122, and the gate capping layer 126 may be sequentially formed in the gate space.

Figure 14:
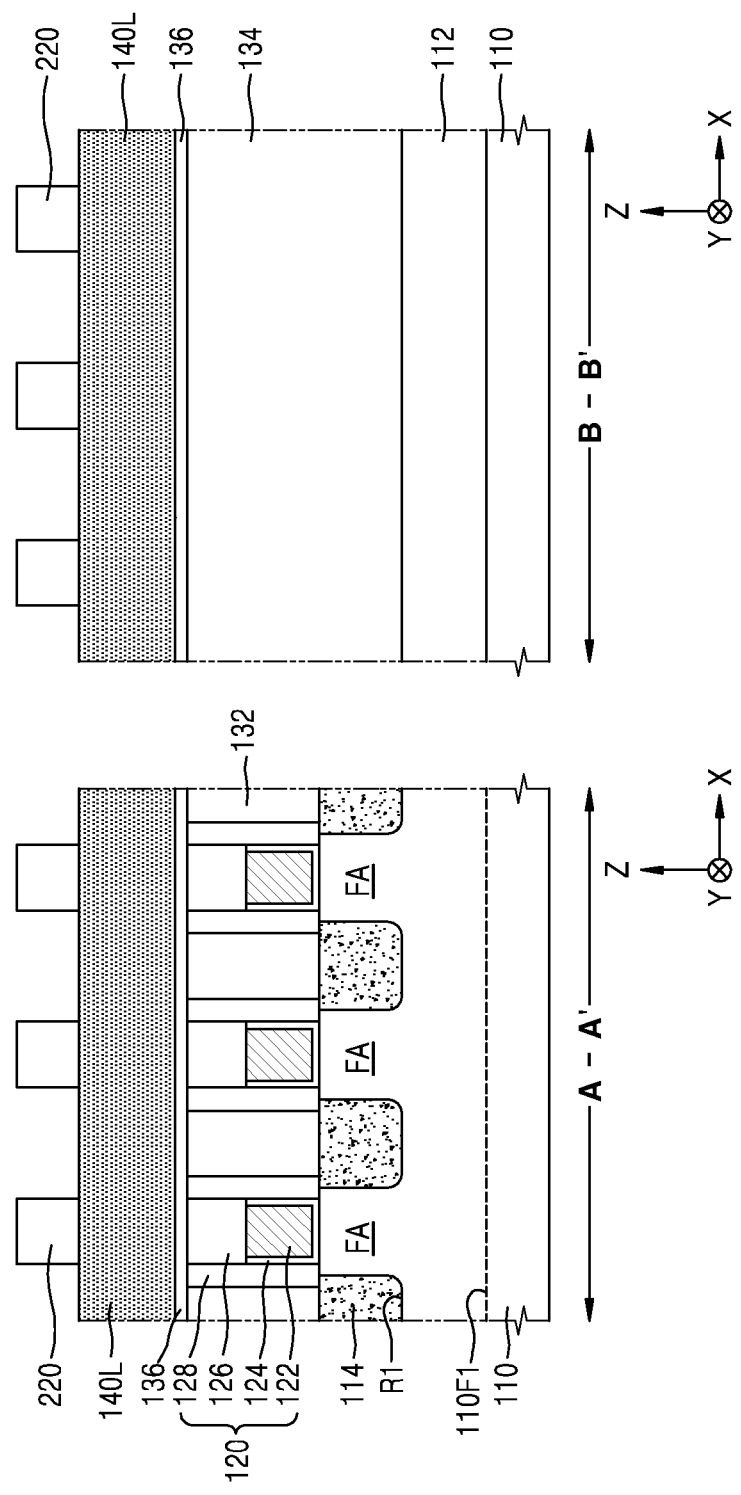

Referring to FIG. 14, the etch stop layer 136 that covers the gate structure 120 and the inter-gate insulating layer 132 is formed and a guide pattern layer 140L may be formed on the etch stop layer 136. The guide pattern layer 140L may be formed by using a material having etching selectivity with respect to the etch stop layer 136. In an example, the etch stop layer 136 is silicon oxide and the guide pattern layer 140L is silicon nitride.

The etch stop layer 136 and the guide pattern layer 140L may also cover an upper surface of the gate isolation insulating layer 134.

Then, a mask pattern 220 may be formed on the guide pattern layer 140L. The mask pattern 220 is formed to overlap the gate structure 120 and may extend in the second direction (the Y direction).

Figure 15:
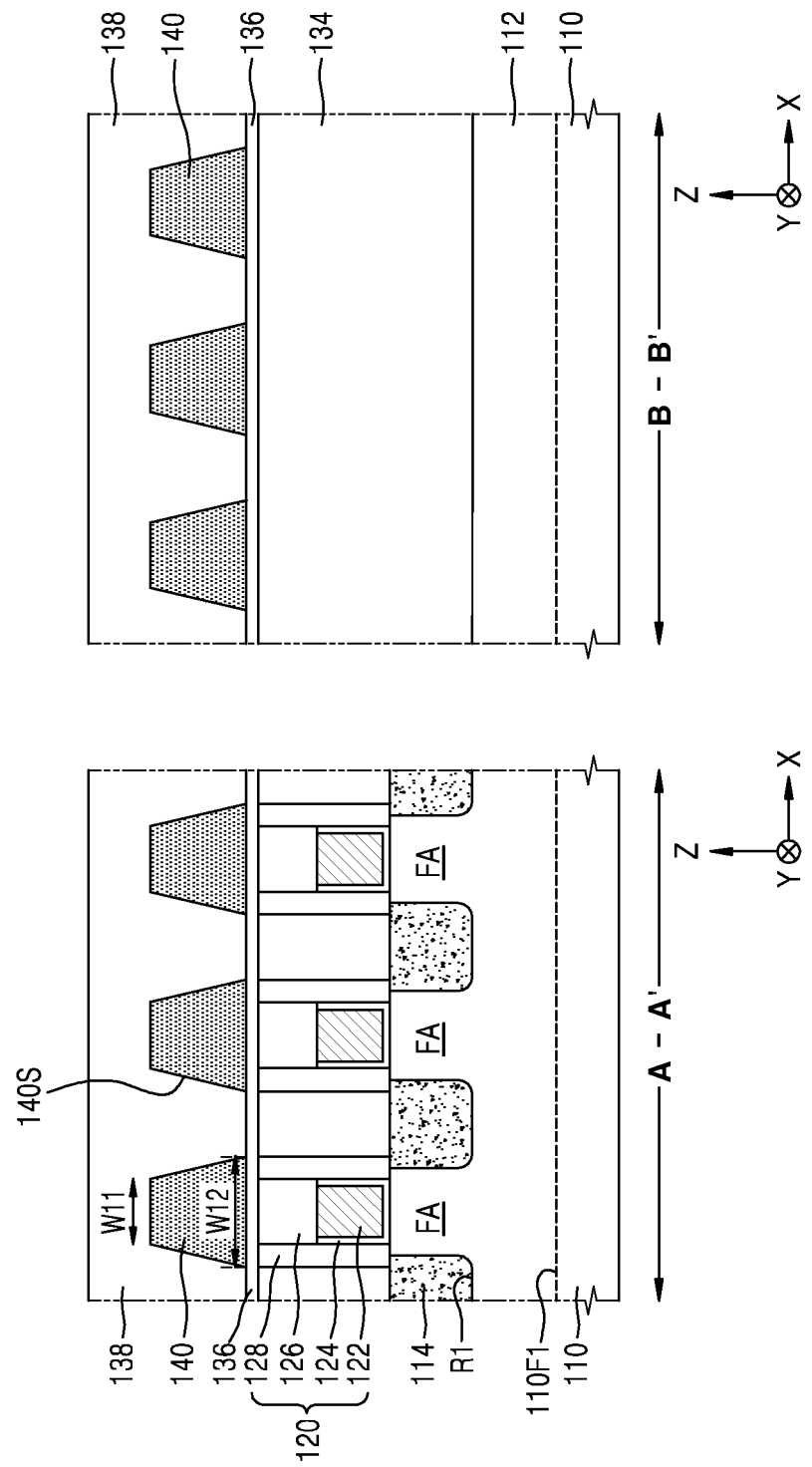

Referring to FIG. 15, the guide pattern 140 may be formed by etching the guide pattern layer 140L (refer to FIG. 14) by using the mask pattern 220 as an etching mask.

The guide pattern 140 may be formed by a taper etching method. For example, the guide pattern 140 may be formed by using an ion beam etching process or an oblique plasma etching process. The guide pattern 140 may include the pair of inclined side surfaces 140S and the upper width W11 may be smaller than the lower width W12.

The etch stop layer 136 may not be etched in the process of forming the guide pattern 140, so that the gate spacer 128 or the inter-gate insulating layer 132 under the etch stop layer 136 is prevented from being damaged.

Then, the mask pattern 220 may be removed. An insulating interlayer 138 may be formed on the guide pattern 140 and the etch stop layer 136. The insulating interlayer 138 may completely cover an upper surface of the guide pattern 140.

Figure 16:
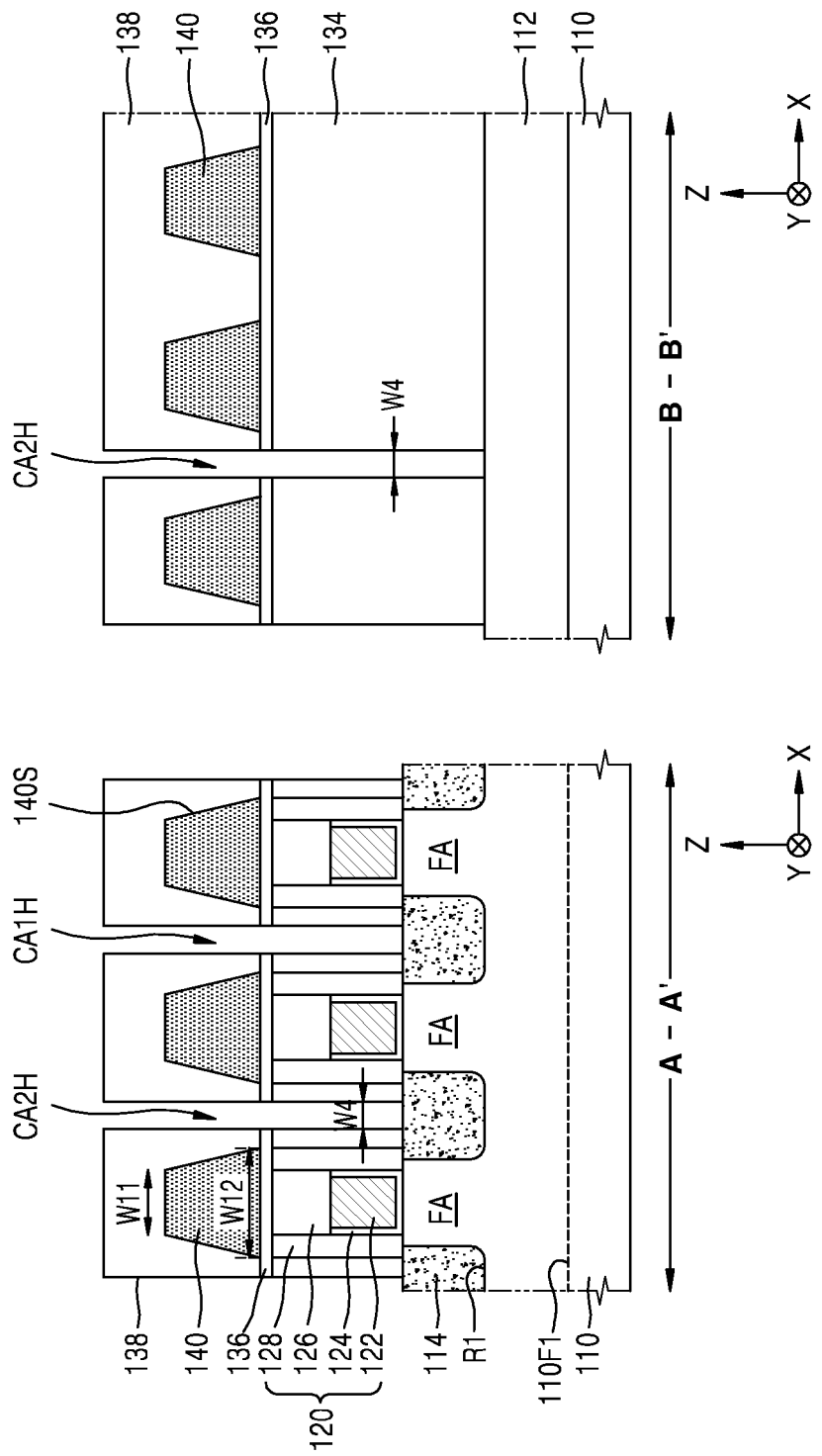

Referring to FIG. 16, the first contact hole CA1H and a second contact hole CA2H that expose a portion of an upper surface of the source/drain region 114 may be formed by forming a mask pattern (not shown) on the insulating interlayer 138 and etching the insulating interlayer 138, the etch stop layer 136, and the inter-gate insulating layer 132 by using the mask pattern as an etching mask.

At this time, each of the first contact hole CA1H and the second contact hole CA2H may have a small width W4 so that the side surface of the gate spacer 128 is not exposed. In an example, the width W4 of each of the first hole CA1H and the second contact hole CA2H is smaller than a distance between the two adjacent gate structures 120.

The first contact hole CA1H may expose an upper surface of the source/drain region 114 between the adjacent gate structures 120. The second contact hole CA2H exposes the upper surface of the source/drain region 114 between the adjacent gate structures 120 and may expose an upper surface of an isolation layer 112 through the gate isolation insulation layer 134.

Figure 17:
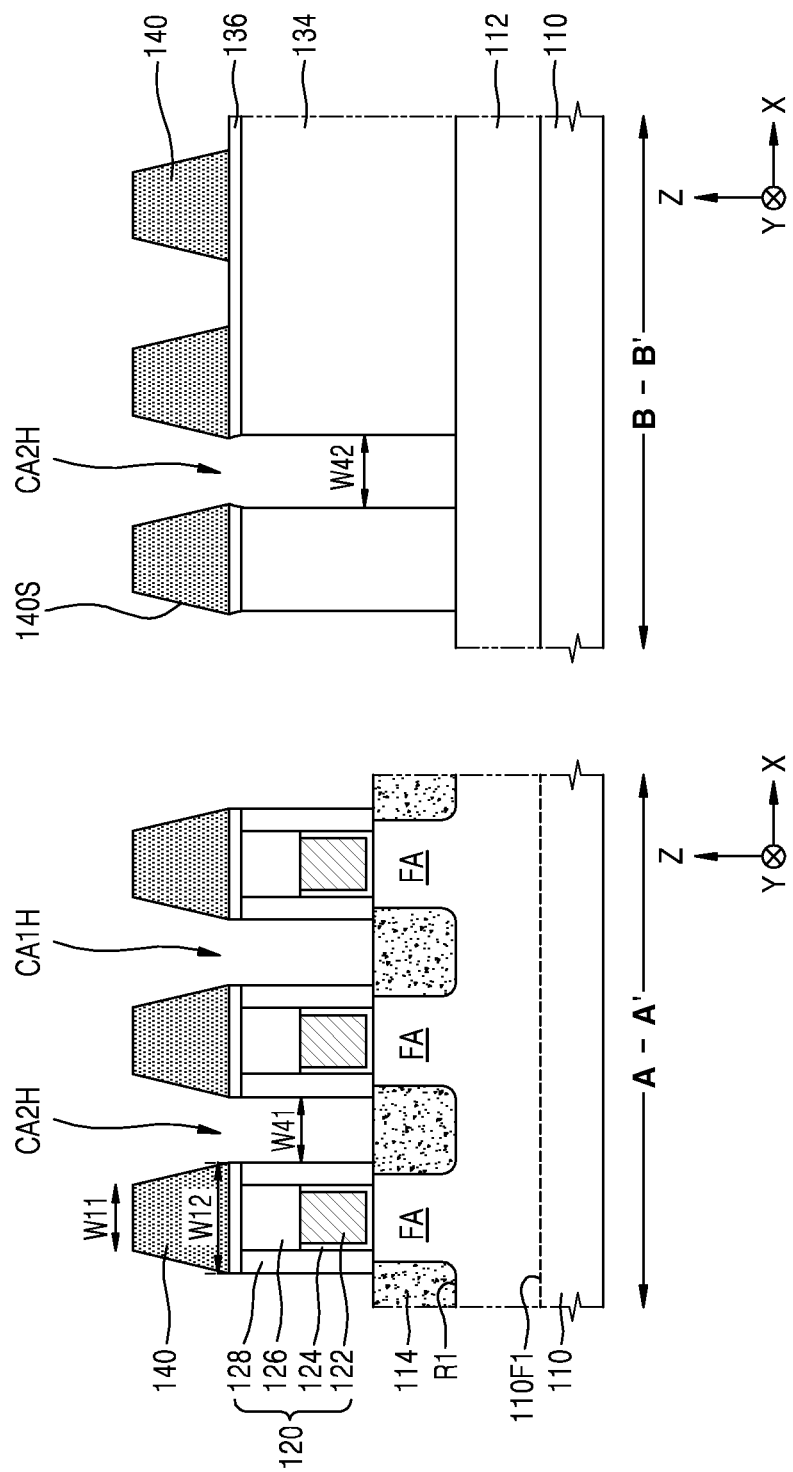

Referring to FIG. 17, the guide pattern 140 and the side surface of the gate spacer 128 may be exposed by removing the inter-gate insulating layer 132, the gate isolation insulating layer 134, and the insulating interlayer 138 that are exposed by the first contact hole CA1H and the second contact hole CA2H.

The removing process may be a process of expanding the first contact hole CA1H and the second contact hole CA2H in a lateral direction. For example, the removing process may be an etch process in which the inter-gate insulating layer 132, the gate isolation insulating layer 134, and the insulating interlayer 138 have a higher etching rate than the gate spacer 128 and the guide pattern 140. The removing process may be a wet etching process or a dry etching process.

In the etching process, as the inter-gate insulating layer 132, the gate isolation insulating layer 134, and the insulating interlayer 138 are etched, the etch stop layer 136 may be etched as well so that sides of the first contact hole CA1H and the second contact hole CA2H have a gentle transition between their upper and lower portions.

In the etching process, because the gate isolation insulating layer 134 has a high etching rate, a large amount of the gate isolation insulating layer 134 exposed by the second contact hole CA2H may be removed. Therefore, a width W42 of the second contact hole CA2H defined between side surfaces of the gate isolation insulating layer 134 may be greater than a width W41 of the second contact hole CA2H defined between side surfaces of the gate spacer 128. That is, as illustrated in FIG. 17, the second contact hole CA2H defined between the side surfaces of the gate isolation insulating layer 134 may include a recess extending from a bottom of the inclined side surfaces 140S of adjacent guide patterns 140.

In general, in accordance with the trend to downscale integrated circuit devices, distances between the gate lines GL are reduced and widths of contacts formed between the gate lines GL are reduced. Due to the contacts having small widths, contact resistance increases or it is difficult to form the contacts. Therefore, in order to maximize the width of the contact, a self-alignment contact using the gate capping layer 126 and the gate spacer 128 as a self-alignment mask is adopted. However, in order to prevent the gate electrode 122 from being damaged or to secure an etching process margin in an etching process for forming the self-alignment contact, it is necessary for the gate capping layer 126 and the gate spacer 128 to have large heights. This increases the difficulty of successfully implementing subsequent processes.

However, according to an aspect of the method according to the inventive concept, after forming the first contact hole CA1H and the second contact hole CA2H having small widths, the first contact hole CA1H and the second contact hole CA2H are expanded laterally until side surfaces of the guide pattern 140 and the gate spacer 128 are exposed. Therefore, in comparison with the case in which a self-alignment contact etching method is used, the gate capping layer 126 and the gate spacer 128 may have small heights. Therefore, precision of subsequent processing may be improved.

Figure 18:
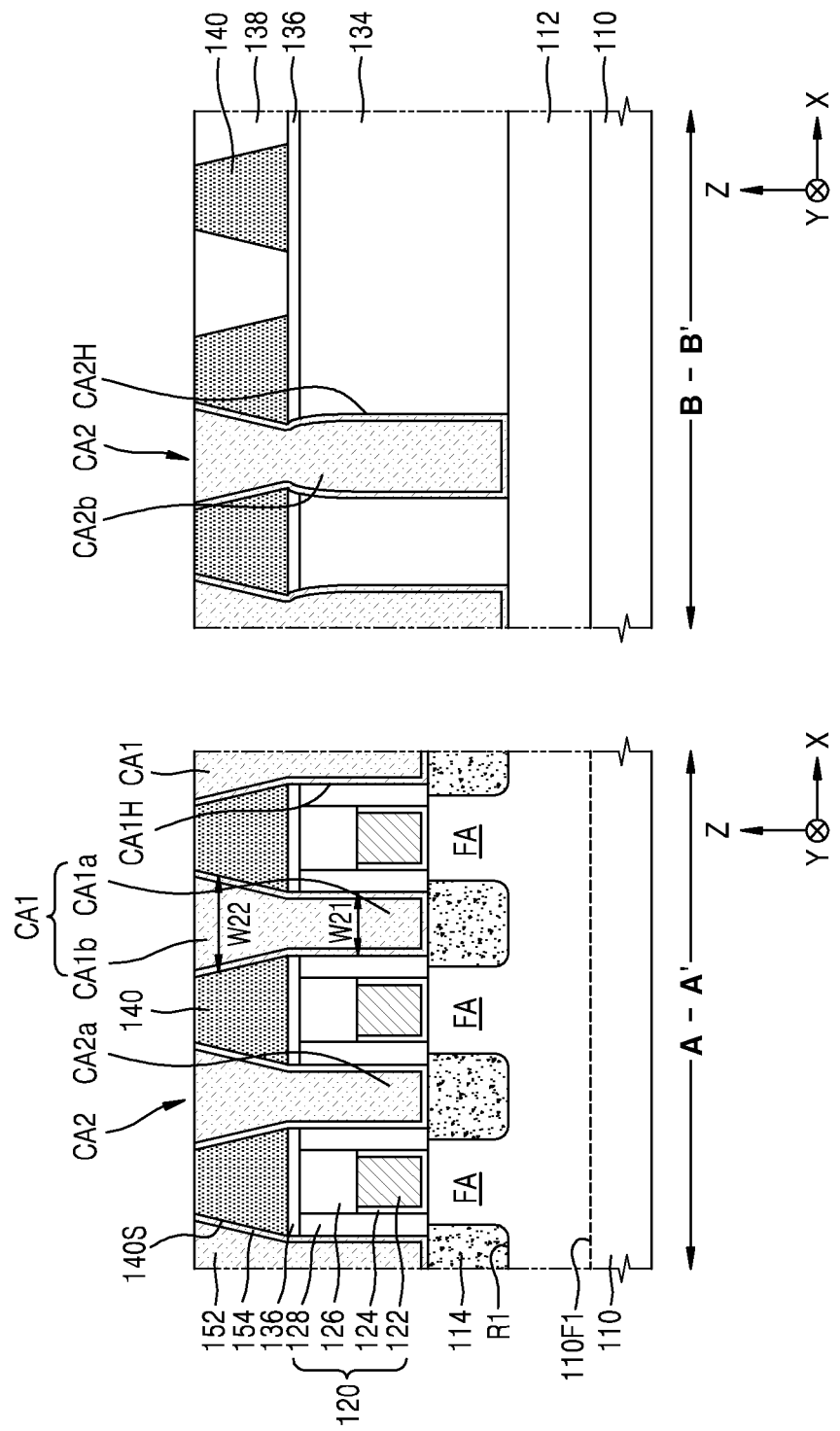

Referring to FIG. 18, a conductive barrier layer 154 may be formed on an internal surface of each of the first contact hole CA1H and the second contact hole CA2H by using Ti, Ta, TiN, TaN, or a combination of the above materials.

Then, the first contact CA1 and the second contact CA2 may be respectively formed in the first contact hole CA1H and the second contact hole CA2H by forming an active contact plug 152 that fills the first contact hole CA1H and the second contact hole CA2H on the conductive barrier layer 154 and removing upper portions of the active contact plug 152 and the conductive barrier layer 154 until the upper surface of the guide pattern 140 is exposed.

The active contact plug 152 may include Co, W, Ni, Ru, Cu, Al, a silicide of the above metals, or an alloy of the above metals. In an example in which the active contact plug 152 includes Co, due to profiles of the first contact hole CA1H and the second contact hole CA2H, a film quality of the active contact plug 152 that fills the first contact hole CA1H and the second contact hole CA2H may be high.

In comparison, if the width of an upper portion of a contact hole is small or if structures such as a kink or step that produce a rapid change in slope at a side of the contact hole are formed, a cobalt source material for forming the active contact plug 152 could not be smoothly supplied into the contact hole. As a result, an abnormal metal layer would be formed is formed on the structures, and/or a void may be formed around the structures. That is, the contact hole would not be completely filled with a cobalt metal layer or a film quality of the cobalt metal layer in the contact hole would be poor.

However, according to the inventive concept, the first contact hole CA1H and the second contact hole CA2H may secure large upper widths due to the inclined side surface 140S. For example, as illustrated in FIG. 18, the upper width W22 of the first contact hole CA1H is greater than the lower width W21. In addition, the first contact hole CA1H and the second contact hole CA2H may have side surface profiles with gently changing slopes, e.g., without any kink. Therefore, the metal layer of Co completely fills the first contact hole CA1H and the second contact hole CA2H or at the very least the metal layer is of a high quality with respect to its performance as a contact.

Referring back to FIG. 4, a third contact hole CB1H and a fourth contact hole CB2H that expose upper surfaces of the gate electrodes 122 may be formed by forming a mask pattern (not shown) on the insulating interlayer 138 and partially removing the guide pattern 140 and the insulating interlayer 138 by using the mask pattern as an etching mask. The guide patterns 140 may be exposed by the third contact hole CB1H and the fourth contact hole CB2H.

Then, the conductive barrier layer 158 may be formed to line each of the third contact hole CB1H and the fourth contact hole CB2H by using Ti, Ta, TiN, TaN, or a combination of the above metals. A third contact CB1 and a fourth contact CB2 that fill the remainder of the third contact hole CB1H and the fourth contact hole CB2H may be formed by forming the gate contact plug 156 on the conductive barrier layer 158. The gate contact plug 156 may include Co, W, Ni, Ru, Cu, Al, a silicide of any one the above metals, or an alloy of any of the above metals. Here and in the description that follows, the term "include" as used in connection with a material(s) of a particular feature may also mean that the feature may consist of the material or a material from the group provided, i.e., that the feature may be formed of one of the materials named or listed.

According to other examples, after forming the first contact hole CA1H and the second contact hole CA2H, and before forming the first contact CA1 and the second contact CA2, the third contact hole CB1H and the fourth contact hole CB2H are formed and then, the first contact CA1, the second contact CA2, the third contact CB1, and the fourth contact CB2 that respectively fill the first hole CA1H, the second contact hole CA2H, the third contact hole CB1H, and the fourth contact hole CB2H are formed.

According to a method of manufacturing the integrated circuit device 100, after forming the guide pattern 140 having the inclined side surface 140S, the contact holes CA1H and CA2H are formed and the contact holes CA1H and CA2H are expanded until the inclined side surfaces 140S of the guide pattern 140 are exposed. Therefore, the contact holes CA1H and CA2H of which upper widths increase and that have gentle side surface profiles may be obtained. When the contact holes CA1H and CA2H are filled with a metal material such as Co, the resulting contacts CA1 and CA2 will be of a high quality.

In addition, in a process of extending the contact holes CA1H and CA2H, when an upper portion of a guide pattern 140A is locally further exposed to an etchant and is removed, an upper edge of the guide pattern 140A may be rounded. In such a case, the integrated circuit device 100B including the guide pattern 140A including the curved inclined side surface 140SA described with reference to FIG. 7 may be obtained.

In addition, although FIG. 14 illustrates an example in which the etch stop layer 136 is formed on the gate structure 120, in another example the inter-gate insulating layer 132 and the guide pattern layer 140L may be formed directly on the gate structure 120 and the inter-gate insulating layer 132. In such a case, the integrated circuit device 100A described with reference to FIGS. 5 and 6 may be formed by a method similar to that otherwise described above with respect to FIGS. 10-18.

Although the inventive concept has been particularly shown and described with reference to examples thereof, it will be understood that various changes in form and details may be made to such examples without departing from the spirit and scope of the inventive concept as defined by the following claims.

What is claimed is:

1. An integrated circuit device comprising:
 a substrate having a fin-type active region that extends longitudinally in a first direction parallel to an upper surface of the substrate;
 a gate structure that intersects the fin-type active region on the substrate and extends longitudinally in a second direction that is perpendicular to the first direction and parallel to the upper surface of the substrate;
 a gate isolation insulating layer on the substrate, the gate isolation insulating layer contacting one end of the gate structure;
 a guide pattern disposed on top of the gate structure and the gate isolation insulating layer, the guide pattern extending longitudinally in the second direction and having an inclined side surface, and a width of an upper portion of the guide pattern being less than a width of a lower portion of the guide pattern as taken in the first direction;
 source/drain regions disposed on both sides of the gate structure; and
 a first contact electrically connected to one of the source/drain regions and having an upper portion that contacts the inclined side surface of the guide pattern.

2. The integrated circuit device of claim 1, wherein the inclined side surface is inclined with respect to the upper surface of the substrate by an angle less than 80°.

3. The integrated circuit device of claim 1, wherein the first contact has a first portion confined to a level beneath a level of an upper surface of the gate structure, and a second portion on the first portion,
 a side surface of the first portion of the first contact is substantially perpendicular to the upper surface of the substrate, and
 a side surface of the second portion of the first contact is inclined with respect to the upper surface of the substrate so as to have a profile conforming to a profile of the inclined side surface of the guide pattern.

4. The integrated circuit device of claim 3, wherein the gate structure comprises:
 a gate electrode that intersects the fin-type active region on the substrate and extends longitudinally in the second direction;
 a gate capping layer disposed on top of the gate electrode and extending longitudinally in the second direction; and
 a gate spacer disposed on side surfaces of both the gate electrode and the gate capping layer,
 wherein the side surface of the first portion of the first contact contacts the gate spacer, and
 the side surface of the second portion of the first contact contacts the inclined side surface of the guide pattern.

5. The integrated circuit device of claim 3, wherein a region of the first contact containing the first portion of the first contact and the second portion of the first contact does not include a step, protrusion or kink.

6. The integrated circuit device of claim 3, further comprising an etch stop layer interposed between the guide pattern and the upper surface of the gate structure,
   wherein the side surface of the first portion of the first contact and the side surface of the second portion of the first contact meet in a region disposed beside the etch stop layer as laterally juxtaposed therewith.

7. The integrated circuit device of claim 6, wherein the etch stop layer is also interposed between the guide pattern and the gate isolation insulating layer.

8. The integrated circuit device of claim 1, wherein the guide pattern overlaps the gate structure and the gate isolation insulating layer, and
   the gate isolation insulating layer has an upper surface at a same level as an upper surface of the gate structure.

9. The integrated circuit device of claim 8, further comprising a second contact that is electrically connected to one of the source/drain regions and extends from a location beside the gate structure to a location beside the gate isolation insulating layer,
   wherein the second contact has one portion that faces a side surface of the gate structure and another portion that faces a side surface of the gate isolation insulating layer, and
   a width of said one portion of the second contact in the first direction is less than a width of said another portion of the second contact in the first direction.

10. The integrated circuit device of claim 1, wherein the guide pattern is disposed directly on the gate structure, and is disposed directly on the gate isolation insulating layer.

11. The integrated circuit device of claim 1, further comprising at least one of:
    a third contact disposed on the gate structure and passing through the guide pattern; and
    a fourth contact disposed on the gate structure and a neighboring gate structure, a portion of a side surface of the fourth contact being covered by the guide pattern.

12. The integrated circuit device of claim 1, wherein at least a portion of the inclined side surface is curved.

13. The integrated circuit device of claim 1, further comprising:
    a trench in the fin-type active region at one side of the gate structure;
    an isolation structure that fills the trench, is separated from the gate structure in the first direction, and extends longitudinally in the second direction; and
    a second guide pattern that extends longitudinally on the isolation structure in the second direction and has an inclined side surface, a width in the first direction of an upper portion of the second guide pattern being less than a width in the first direction of a lower portion of the second guide pattern.

14. An integrated circuit device comprising:
    a substrate having a fin-type active region that extends longitudinally in a first direction parallel to an upper surface of the substrate;
    a plurality of gate structures that intersects the fin-type active region on the substrate, each of the gate structures extending longitudinally in a second direction that is perpendicular to the first direction and parallel with the upper surface of the substrate;
    guide patterns disposed on top of the gate structures, respectively, each of the guide patterns extending longitudinally in the second direction and having inclined side surfaces, and a width in the first direction of an upper portion of each of the guide patterns being less than a width of a lower portion of the guide pattern as taken in the first direction;
    a source/drain region, two of the gate structures that are adjacent one another in the first direction being located on opposite sides of the source/drain region;
    an active contact electrically connected to the source/drain region, an upper portion of the active contact interposed between opposing ones of the inclined side surfaces of two of the guide patterns respectively disposed on the two of the gate structures that are adjacent one another in the first direction; and
    a gate isolation insulating layer that extends longitudinally in the first direction on the substrate and contacts one end of the plurality of gate structures,
    wherein at least one of the guide patterns extends longitudinally in the second direction on the gate isolation insulating layer.

15. The integrated circuit device of claim 14, wherein the active contact has a first portion interposed between the two of the gate structures that are adjacent one another in the first direction, and a second portion interposed between the two guide patterns disposed on top of the two of the gate structures that are adjacent one another in the first direction,
    side surfaces of the first portion of the active contact are substantially perpendicular to the upper surface of the substrate, and
    side surfaces of the second portion of the active contact are inclined with respect to the upper surface of the substrate so as to have profiles conforming to profiles of the inclined side surfaces of said two of the guide patterns.

16. The integrated circuit device of claim 14, wherein the active contact extends longitudinally in the second direction from a location between the two of the gate structures adjacent one another in the first direction to a location beyond ends of said two of the gate structures,
    the gate isolation insulating layer is disposed on both sides of the active contact, and
    the active contact has one portion interposed between the two of the gate structures adjacent to one another in the first direction, and another portion that is disposed beside the gate isolation insulating layer,
    a width of said one portion of the active contact is less than a width said another portion of the active contact.

17. The integrated circuit device of claim 14, further comprising a gate contact disposed on one of the gate structures,
    wherein at least one portion of a side surface of the gate contact is covered by the guide pattern disposed on said one of the gate structures.

18. An integrated circuit device comprising:
    a substrate having a fin-type active region that extends longitudinally in a first direction parallel to an upper surface of the substrate;
    a gate structure that intersects the fin-type active region on the substrate, the gate structure including a gate electrode that extends longitudinally in a second direction that is perpendicular to the first direction and parallel to the upper surface of the substrate;
    a gate isolation insulating layer on the substrate, the gate isolation insulating layer contacting one end of the gate structure;
    a guide pattern disposed on top of the gate structure and the gate isolation insulating layer, the guide pattern extending longitudinally in the second direction;

source/drain regions disposed on both sides of the gate structure; and a contact that is electrically connected to one of the source/drain regions, wherein the guide pattern has a cross section, in a vertical plane perpendicular to the upper surface of the substrate and parallel to the first direction, that tapers in an upward direction away from the gate structure such that a width of an upper portion of the guide pattern is less than a width of a lower portion of the guide pattern, and the contact has an upper portion that is disposed beside the guide pattern as laterally juxtaposed therewith in the first direction and a lower portion that is disposed beside the gate structure as laterally juxtaposed therewith in the first direction, the upper portion of the contact having a cross section in said vertical plane that tapers in a downward direction toward the upper surface of the substrate.

19. The integrated circuit device of claim 18, wherein the guide pattern has a planar side surface extending obliquely relative to the upper surface of the substrate, and the upper portion of the contact has a planar side surface that extends obliquely and substantially parallel to the planar side surface of the guide pattern.

20. The integrated circuit device of claim 18, wherein the guide pattern has a convex side surface, and the upper portion of the contact has a convex side surface that is complementary to the convex side surface of the guide pattern.

* * * * *